United States Patent
Endo et al.

(10) Patent No.: US 10,047,224 B2
(45) Date of Patent: Aug. 14, 2018

(54) CURED PRODUCT OF POLYPHENYLENE ETHER-CONTAINING RESIN COMPOSITION

(71) Applicant: ASAHI KASEI KABUSHIKI KAISHA, Tokyo (JP)

(72) Inventors: Masaaki Endo, Tokyo (JP); Shoji Otani, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/037,936

(22) PCT Filed: Nov. 19, 2014

(86) PCT No.: PCT/JP2014/080614
§ 371 (c)(1),
(2) Date: May 19, 2016

(87) PCT Pub. No.: WO2015/076288
PCT Pub. Date: May 28, 2015

(65) Prior Publication Data
US 2016/0289446 A1 Oct. 6, 2016

(30) Foreign Application Priority Data
Nov. 20, 2013 (JP) .................................. 2013-240057

(51) Int. Cl.
*C08L 71/12* (2006.01)
*H05K 1/03* (2006.01)
(Continued)

(52) U.S. Cl.
CPC ................ *C08L 71/12* (2013.01); *C08K 5/14* (2013.01); *C08K 5/34924* (2013.01); *H05K 1/024* (2013.01); *H05K 1/0353* (2013.01)

(58) Field of Classification Search
CPC ........................................................ C08L 71/12
(Continued)

(56) References Cited

U.S. PATENT DOCUMENTS

2004/0132925 A1 7/2004 Saitou et al.
2014/0127462 A1 5/2014 Endo et al.

FOREIGN PATENT DOCUMENTS

| CN | 1454240 A | 11/2003 |
| EP | 1 630 199 A1 | 3/2006 |

(Continued)

OTHER PUBLICATIONS

Fujiwara et al., "Low Dielectric, High Heat-Resistant Material for Multilayer Printed Wiring Board," Panasonic Electric Works Technical Report (Dec. 2008), vol. 56, No. 4, pp. 24-28, with English abstract.

(Continued)

*Primary Examiner* — Duc Truong
(74) *Attorney, Agent, or Firm* — Birch, Stewart, Kolasch & Birch, LLP

(57) ABSTRACT

The description of the present application describes a cured product that is obtained by compression molding a resin composition that contains a polyphenylene ether (A) and a cross-linking curable compound (B). A phase separated structure that comprises a dispersed phase and a continuous phase is observed in a 10,000× morphological image that is observed from the vertical direction of a compression surface of the cured product using a transmission electron microscope. In a 200,000× morphological image that is observed from the vertical direction of the compression surface of the cured product using a transmission electron microscope, the continuous phase has a co-continuous structure that includes an A phase that has the polyphenylene ether (A) as a principal component and a B phase that has the (Continued)

cross-linking curable compound (B) as a principal component, the proportion of the area of the co-continuous structure occupied by the A phase being 40%-90% of the area.

15 Claims, 7 Drawing Sheets

(51) Int. Cl.
    *C08K 5/14* (2006.01)
    *C08K 5/3492* (2006.01)
    *H05K 1/02* (2006.01)
    *C08K 5/03* (2006.01)
    *C08J 5/24* (2006.01)

(58) Field of Classification Search
    USPC .......................................................... 428/457
    See application file for complete search history.

(56) References Cited

FOREIGN PATENT DOCUMENTS

| JP | 2009-78209 A | 4/2000 |
|---|---|---|
| JP | 2002-265777 A | 9/2002 |
| JP | 2003-138127 A | 5/2003 |
| JP | 2003-238925 A | 8/2003 |
| JP | 2004-168902 A | 6/2004 |
| JP | 2004-259899 A | 9/2004 |
| JP | 2006-516297 A | 6/2006 |
| JP | 2014-1274 A | 9/2014 |
| JP | 2014-198773 A | 10/2014 |
| WO | WO 02/18493 A1 | 3/2002 |
| WO | WO 2004/067634 A1 | 8/2004 |
| WO | WO 2004/104097 A1 | 12/2004 |
| WO | WO 2013/141255 A1 | 9/2013 |

OTHER PUBLICATIONS

Fujiwara et al., "Reactive Processing of Thermoset/Thermoplastic Blends: A Potential for Injection Molding," Polymer Engineering and Science (Mid-Jun. 1996), vol. 36, No. 11, pp. 1541-1546.

International Preliminary Report on Patentability dated May 26, 2016, in PCT International Application No. PCT/JP2014/080614, with English Translation.

International Search Report dated Feb. 24, 2015, in PCT International Application No. PCT/JP2014/080614, with English translation.

CURED PRODUCT OF POLYPHENYLENE ETHER-CONTAINING RESIN COMPOSITION

TECHNICAL FIELD

The present invention relates to a cured product of a resin composition containing a polyphenylene ether (hereinafter, sometimes referred to as PPE), which can be suitably used for an electronic circuit board material etc., and an electronic circuit board containing the cured product as a constituent.

BACKGROUND ART

In recent years, with the marked progress of information network technology and the expansion of services utilizing the information network, it is required for an electronic device to process a large amount of information and provide a high processing speed. In order to transmit a large volume of digital signals at a high speed, a signal with a shorter wavelength is effective, and the signal is evolving to a higher frequency signal. PPE has excellent high-frequency characteristics (i.e., dielectric characteristics), such as dielectric constant and dielectric loss tangent, as well as high heat resistance and therefore, is suitable as an insulating material for an electronic circuit board of an electronic device utilizing a high frequency band.

In general, PPE is originally a thermoplastic resin and therefore, is used together with a crosslinking curable compound at the time of use as an insulating material for an electronic circuit board. A cured product of a resin composition containing PPE and a crosslinking curable compound can have, as an insulating material for an electronic circuit board, both dielectric characteristics and heat resistance necessary for process compatibility to lead-free solder mounting, etc.

Many attempts have been made to provide a cured product of a resin composition containing PPE and a crosslinking curable compound and are described, for example, in Patent Documents 1 to 5 and Non-Patent Documents 1 and 2.

The resin composition containing PPE and a crosslinking curable compound, reported in Non-Patent Document 1, Patent Documents 1 and 2, etc., is characterized by a uniform structure with no phase separation between PPE and the crosslinking curable compound.

In Non-Patent Document 1, it is stated that PPE and a crosslinking curable compound have good compatibility and the cured product with the phase structure being a uniform phase is excellent in the heat resistance and is suitable as a low-dielectric/highly heat-resistant multilayered printed wiring board material. On the contrary, Non-Patent Document 1 indicates that when a phase separation structure of PPE and the crosslinking curable compound is observed, the adherence at the interface is reduced to deteriorate the heat resistance. Based on FIG. 2 of Non-Patent Document 1, the size of dispersed phase, at which the deterioration of heat resistance occurs, is from about 1.0 μm to about 17 μm.

Patent Document 1 describes a resin composition for a printed wiring board, containing PPE, an epoxy resin (crosslinking curable compound), and a curing agent for the epoxy resin, and it is stated that the composition does not cause a phase separation in the curing process and therefore, ensures high adhesiveness or heat resistance and excellent electric characteristics.

In Patent Document 2, it is stated that PPE and a thermosetting resin (crosslinking curable compound) exhibit a uniform morphology and a printed wiring board excellent in the heat resistance and electric characteristics can be thereby obtained. Patent Document 2 indicates that when an epoxy resin phase having a particle diameter of 1 μm or more is observed, the interface adherence between two phases is weak and the heat resistance is disadvantageously deteriorated.

On the other hand, Non-Patent Document 2 describes a structure where phase separation of PPE and a crosslinking curable compound is produced. In Non-Patent Document 2, it is stated that a thermally cured product of an extrusion molded article of a resin composition containing PPE, TAIC (crosslinking curable compound) and an initiator (α,α'-bis(tert-butylperoxy-m-isopropyl)benzene)) has a periodic structure.

In Non-Patent Document 2, application of the thermally cured product to a printed wiring board is not described, but in Patent Documents 3 and 4, it is stated that a cured product of a resin composition equivalent to the resin composition described in Non-Patent Document 2 is suitable for a printed wiring board. The resin composition described in Patent Document 3 contains PPE, TAIC and an initiator (Perbutyl P, α,α'-bis(tert-butylperoxy-m-isopropyl)benzene). The resin composition described in Patent Document 4 contains a styrene-butadiene copolymer, in addition to PPE, TAIC and an initiator (α,α' bis(tert-butylperoxy-m-isopropyl)benzene). Patent Documents 3 and 4 are silent regarding the morphology of the cured product, but because of having a resin structure equivalent to that in Non-Patent Document 2, the morphology is also expected to be equivalent to that in Non-Patent Document 2.

In Patent Document 5, it is also stated that a resin composition containing PPE, an epoxy resin (as a crosslinking curable compound, a bisphenol A epoxy resin and a cresol-novolak epoxy resin), and an epoxy group-containing [styrene-butadiene-styrene] block copolymer takes on a phase separation structure.

RELATED ART

Patent Document

Patent Document 1: International Publication No. 2004/104097, pamphlet
Patent Document 2: Kokai (Japanese Unexamined Patent Publication) No. 2004-168902
Patent Document 3: Kokai No. 2004-259899
Patent Document 4: Kokai No. 2002-265777
Patent Document 5: Kokai No. 2003-238925

Non-Patent Document

Non-Patent Document 1: Panasonic Electric Works technical report, Vol. 56, No. 4
Non-Patent Document 2: T. Inoue, Poly. Eng. Sci. 36, 11, p. 1541 (1996)

SUMMARY OF THE INVENTION

Problems to be Solved by the Invention

The cured products of the PPE-containing resin compositions described in Non-Patent Document 1 and Patent Documents 1 and 2 are free of a phase separation structure and have a uniform morphology, where the heat resistance is enhanced due to this morphology. However, in the cured products of the PPE-containing resin compositions described in Non-Patent Document 1 and Patent Documents 1 and 2, the dielectric loss tangent is high (for example, 0.005 at 1 GHz in Non-Patent Document 1, and from 0.006 to 0.009 at 1 MHz in Examples 1 to 4 of Patent Document 1) and is significantly poor as dielectric characteristics required of the recent high-frequency substrate.

Non-Patent Document 2 discloses that the cured product of the PPE-containing resin composition causes a phase separation, but does not refer to using the cured product as a printed wiring board material and is silent particularly on the dielectric characteristics.

The dielectric loss tangent of the cured product of the PPE-containing resin composition described in Patent Document 3 is as high as from 0.0025 to 0.0032 at 1 MHz (Examples of Patent Document 3) and cannot be compatible with the GHz band. Patent Document 4 has no specific description with respect to dielectric characteristics of the cured product of the PPE-containing resin composition. Patent Document 4 discloses that the resin cured product is excellent in the heat resistance, but in a solder heat resistance test at 260° C., the resin cured product is found to be inapplicable to lead flow soldering.

As described above, the cured products of PPE-containing resin compositions described in Non-Patent Document 2 and Patent Documents 3 and 4 are also required to be further improved as an insulating material for an electronic circuit substrate of an electronic device utilizing a high-frequency band (GHz band).

The cured product of the PPE-containing resin composition described in Patent Document 5 is invented with the aim of improving heat resistance and crack resistance, and Patent Document 5 is silent regarding the dielectric characteristics of the cured product.

Accordingly, the problem to be solved by the present invention is to provide a cured product of a resin composition containing PPE as the main component, which has excellent electric characteristics in a high-frequency band (GHz band) and has heat resistance necessary for process compatibility (particularly, good heat resistance in solder heat resistance test, T288 test and T300 test).

Means to Solve the Problems

The present inventors have made intensive studies to solve the above-described problems and done many experiments, as a result, it has been found that when a cured product of a resin composition containing PPE and a crosslinking curable compound has a specific morphology, the cured product can be formed into a substrate, etc., without impairing the dielectric characteristics and heat resistance which are inherent to PPE. The present invention has been accomplished based on this finding.

More specifically, the present invention is as follows.

[1]

A cured product obtained by compression-molding a resin composition containing a polyphenylene ether (A) and a crosslinking curable compound (B), wherein in a morphological image at 10,000× magnification as observed from a direction vertical to a compression surface by using a transmission electron microscope, a phase separation structure consisting of a dispersed phase and a continuous phase is observed, and in a morphological image at 200,000× magnification as observed from the direction vertical to the compression surface by using the transmission electron microscope, the continuous phase has a co-continuous structure including an A phase mainly containing the polyphenylene ether (A) and a B phase mainly containing the crosslinking curable compound (B), and the area proportion of the A phase in the continuous phase is from 40 to 90 area %.

[2]

The cured product according to [1], wherein in the morphological image at 200,000× magnification as observed from the direction vertical to the compression surface by using the transmission electron microscope, the structural period of the co-continuous structure is from 0.5 to 50 nm.

[3]

The cured product according to [1] or [2], wherein in the morphological image at 200,000× magnification as observed from the direction vertical to the compression surface by using the transmission electron microscope, the area proportion of the A phase in the continuous phase is from 50 to 80 area %.

[4]

The cured product according to [1] or [2], wherein in the morphological image at 200,000× magnification as observed from the direction vertical to the compression surface by using the transmission electron microscope, the area proportion of the A phase in the continuous phase is from 55 to 70 area %.

[5]

The cured product according to any one of [1] to [4], wherein in the morphological image at 10,000× magnification as observed from the direction vertical to the compression surface by using the transmission electron microscope, the area proportion of the dispersed phase is from 10 to 80 area %.

[6]

The cured product according to any one of [1] to [5], wherein in the morphological image at 10,000× magnification as observed from the direction vertical to the compression surface by using the transmission electron microscope, a spherical dispersed phase having a long diameter ranging from 0.001 μm to less than 1.0 μm and a long diameter/short diameter ratio of 1.0 to 3.0 exists.

[7]

The cured product according to [6], wherein in the morphological image at 10,000× magnification as observed from the direction vertical to the compression surface by using the transmission electron microscope, the area proportion of the spherical dispersed phase is from 10 to 80 area %.

[8]

The cured product according to [6] or [7], wherein in the morphological image at 10,000× magnification as observed from the direction vertical to the compression surface by using the transmission electron microscope, a string-like dispersed phase having a long diameter of 1.0 to 18 μm, a short diameter of 0.001 to 2.0 μm, and a long diameter/short diameter ratio of 2.0 to 30 exists, in addition to the spherical dispersed phase.

[9]

The cured product according to [8], wherein in the morphological image at 10,000× magnification as observed from the direction vertical to the compression surface by using the transmission electron microscope, the area proportion of the spherical dispersed phase and the string-like dispersed phase is from 10 to 80 area %.

[10]

The cured product according to [8] or [9], wherein in the morphological image at 10,000× magnification as observed from the direction vertical to the compression surface by using the transmission electron microscope, the area proportion of the string-like dispersed phase is from 50 to 90 area % relative to the total of areas of the spherical dispersed phase and the string-like dispersed phase.

[11]

The cured product according to [8] or [9], wherein in the morphological image at 10,000× magnification as observed from the direction vertical to the compression surface by using the transmission electron microscope, the area proportion of the string-like dispersed phase is from 70 to 90 area % relative to the total of areas of the spherical dispersed phase and the string-like dispersed phase.

[12]

The cured product according to any one of [1] to [11], wherein the content of the polyphenylene ether (A) is from 20 to 60 mass % based on 100 mass % of the mass of the cured product.

[13]

The cured product according to any one of [1] to [12], wherein the resin composition further contains a hydrogenated block copolymer (C) obtained by hydrogenating a vinyl aromatic compound-conjugated diene compound block copolymer and an organic peroxide (D), in addition to the polyphenylene ether (A) and the crosslinking curable compound (B), a content of a vinyl aromatic compound unit in the hydrogenated block copolymer (C) is from 5 to 50 mass %, a content of the hydrogenated block copolymer (C) is from 3 to 20 parts by mass based on 100 parts by mass of the total mass of the polyphenylene ether (A) and the crosslinking curable compound (B), a one-minute half-life temperature of the organic peroxide (D) is from 150 to 190° C., and the content of the organic peroxide (D) is from 1 to 5 parts by mass based on 100 parts by mass of the total mass of the polyphenylene ether (A) and the crosslinking curable compound (B).

[14]

The cured product according to [13], wherein the composition further contains an organic peroxide (F) having a one-minute half-life temperature ranging from more than 190° C. to 250° C. and the content of the organic peroxide (F) is from 1 to 3 parts by mass based on 100 parts by mass of the total mass of the polyphenylene ether (A) and the crosslinking curable compound (B).

[15]

The cured product according to any one of [1] to [14], wherein the composition further contains a P atom-containing compound (E) compatible with both of the polyphenylene ether (A) and the crosslinking curable compound (B), in addition to the polyphenylene ether (A) and the crosslinking curable compound (B), the content of the P atom-containing compound (E) is from 0.5 to 15 parts by mass based on 100 parts by mass of the total mass of the polyphenylene ether (A) and the P atom-containing compound (E), and the total content of the crosslinking curable compound (B) and the P atom-containing compound (E) is from 30 to 45 mass % based on 100 mass % of the total mass of the polyphenylene ether (A), the crosslinking curable compound (B) and the P atom-containing compound (E).

[16]

An electronic circuit substrate containing the cured product according to any one of [1] to [15], which is selected from a resin film, a composite obtained by curing a resin of a prepreg as an impregnated composite of a base material and the resin, a resin-attached metal foil, and a laminate composed of two or more thereof.

Effects of the Invention

According to the present invention, a cured product of a PPE-containing resin composition, ensuring both excellent electric characteristics in a high-frequency band (GHz band) and heat resistance necessary for process compatibility, and an electronic circuit substrate containing the cured product, can be provided.

MODE FOR CARRYING OUT THE INVENTION

Figure 1:
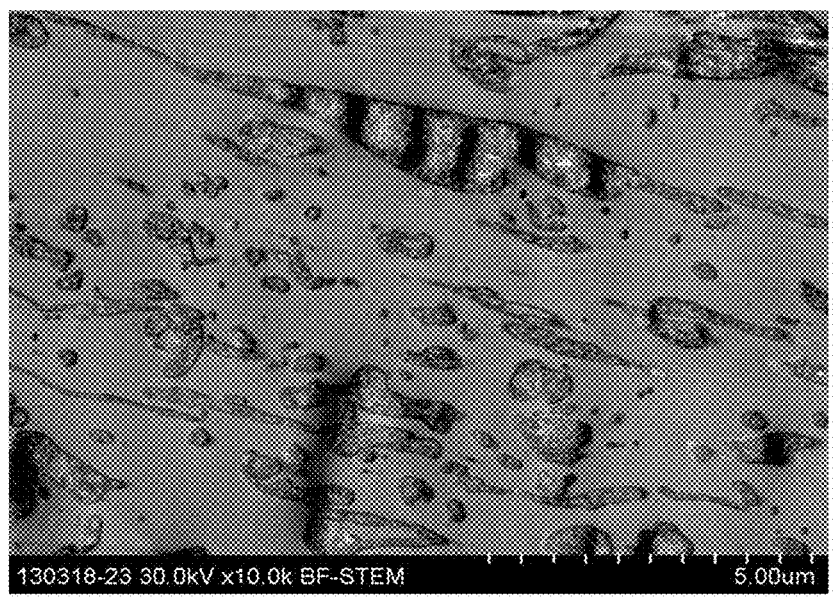
FIG. 1 A view illustrating a morphological image by a transmission electron microscope (10,000× magnification) of the cured product produced in Example 2.

The mode for carrying out the present invention (hereinafter, simply referred to as "embodiment") is described in detail below. The present invention is not limited to the following description and can be implemented by making appropriate modifications within the scope of the gist thereof.

<Cured Product>

In the first embodiment, a cured product is obtained by compression-molding a resin composition containing a polyphenylene ether (A) (hereinafter, sometimes referred to as PPE (A)) and a crosslinking curable compound (B).

<Morphology>

In the first embodiment, in a morphological image at 10,000× magnification as observed from a direction vertical to a compression surface by using a transmission electron microscope, a phase separation structure consisting of a dispersed phase and a continuous phase is observed. In addition, in a morphological image at 200,000× magnification as observed from the direction vertical to the compression surface by using a transmission electron microscope, the continuous phase has a co-continuous structure including an A phase containing the polyphenylene ether (A) as the main component and a B phase containing the crosslinking curable compound (B) as the main component, and the area proportion of the A phase in the continuous phase is from 40 to 90 area %.

Throughout the present disclosure, the morphological image observed by a transmission microscope is an image obtained by subjecting an ultrathin section of 30 to 50 nm in thickness processed by an ultramicrotome to staining with ruthenium tetroxide to prepare a sample for microscopic examination and photographing the sample for microscopic examination by means of a transmission microscope under the condition of an accelerating voltage of 30 kV. As a specific photographing method, a method used for morphology observation in Examples is described below. The cured product of the PPE-containing resin composition is embedded in an epoxy-based resin and cut out into the compression surface by an ultramicrotome to produce an ultrathin section of 30 to 50 nm in thickness. The ultrathin section for microscopic examination is placed on a grid for eye examination and stained with ruthenium tetroxide to prepare a sample for microscopic examination. The sample for microscopic examination is observed using a transmission electron microscope (LEICA ULTRA CUTUCT, S-5500, manufactured by Hitachi Ltd.) under the condition of an accelerating voltage of 30 kV.

The morphology observation by a transmission electron microscope (10,000× magnification) as used in the present disclosure means to observe all target dispersed phases existing in an observation image by carrying out the transmission electron microscope (10,000× magnification) observation such that the observation image has a visual field of 105.9 $\mu m^2$. In FIGS. 1 to 7 described later, a transmission electron microscope (10,000× magnification) observation image in a visual field of 105.9 $\mu m^2$ (11.9 $\mu m \times 8.9$ $\mu m$) is illustrated.

Figure 2:
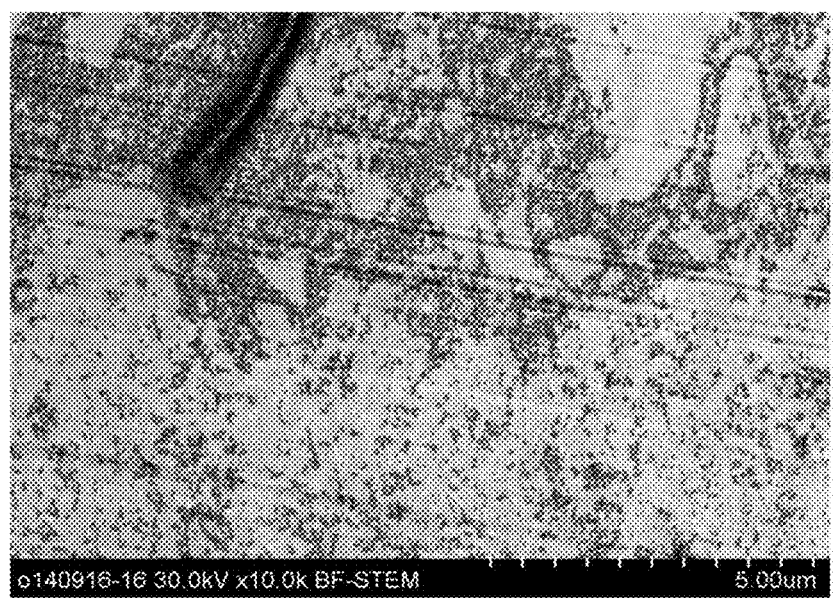
FIG. 2 A view illustrating a morphological image by a transmission electron microscope (10,000× magnification) of the cured product produced in Example 5.
Figure 3:
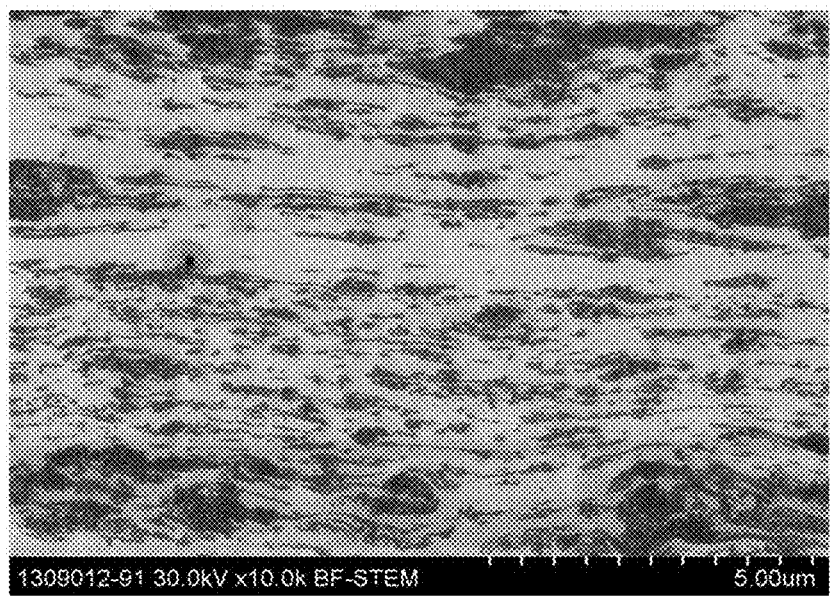
FIG. 3 A view illustrating a morphological image by a transmission electron microscope (10,000× magnification) of the cured product produced in Example 8.
Figure 4:
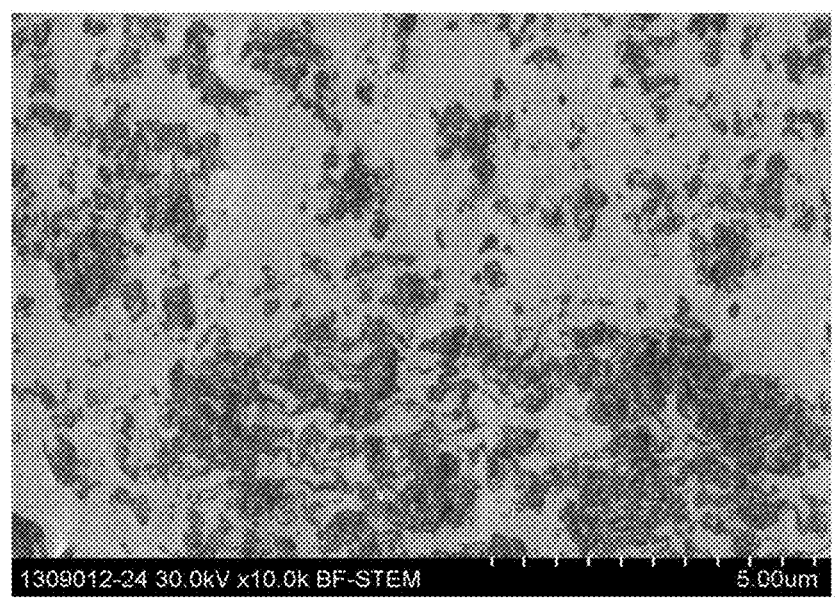
FIG. 4 A view illustrating a morphological image by a transmission electron microscope (10,000× magnification) of the cured product produced in Example 9.
Figure 5:
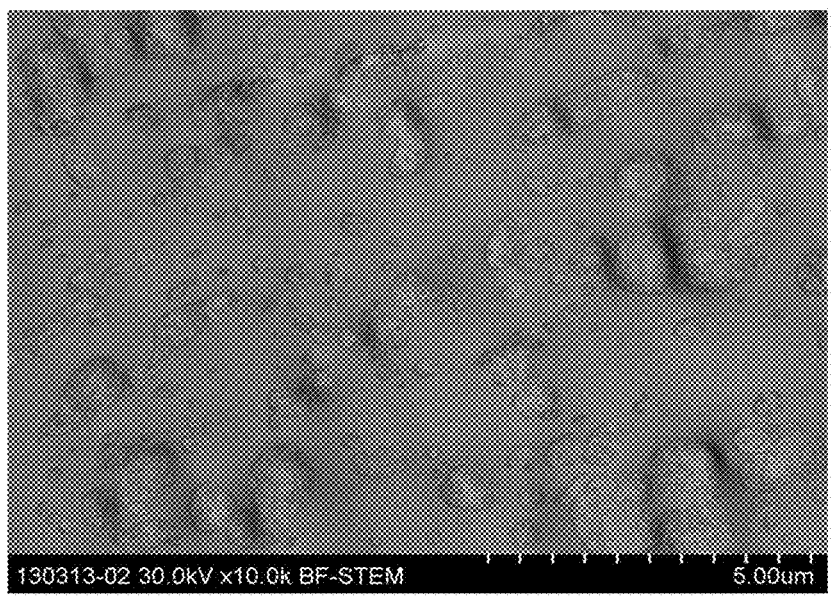
FIG. 5 A view illustrating a morphological image by a transmission electron microscope (10,000× magnification) of the cured product produced in Comparative Example 1.
Figure 6:
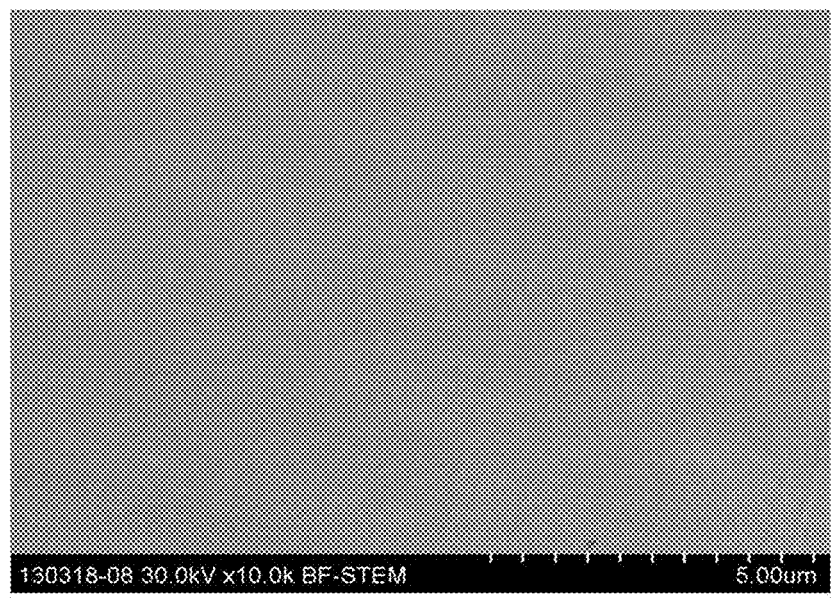
FIG. 6 A view illustrating a morphological image by a transmission electron microscope (10,000× magnification) of the cured product produced in Comparative Example 4.
Figure 7:
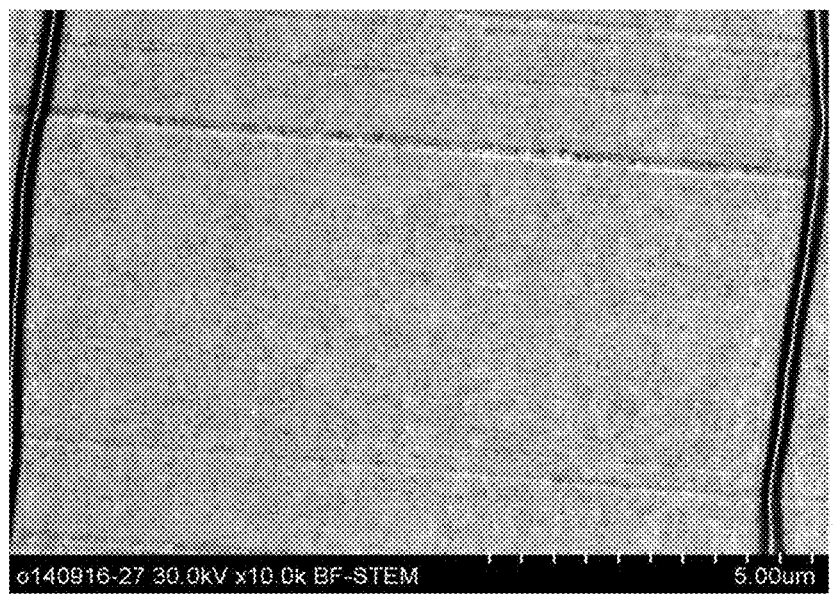
FIG. 7 A view illustrating a morphological image by a transmission electron microscope (10,000× magnification) of the cured product produced in Comparative Example 5.

FIGS. 1 and 3 illustrate a transmission electron microscope image of the cured product of a PPE-containing resin composition, where in morphology observation at 10,000× magnification by a transmission electron microscope, a spherical dispersed phase and a string-like dispersed phase coexist (FIG. 1: the resin cured product of Example 2, FIG. 3: the resin cured product of Example 8). FIG. 2 (the resin cured product of Example 5) illustrates a transmission electron microscope image of the cured product of a PPE-containing resin composition, where a spherical dispersed phase exists. FIGS. 4 and 5 illustrate a transmission electron microscope image of the cured product of a PPE-containing resin composition, where a coarse dispersed phase different from a spherical dispersed phase and a string-like dispersed phase accounts for the majority (FIG. 4: the resin cured product of Example 9, FIG. 5: the resin cured product of Comparative Example 1). FIGS. 6 and 7 illustrate a transmission electron microscope image of the cured product of a PPE-containing resin composition, where phase separation does not exist and a uniform morphology is displayed (FIG. 6: the resin cured product of Comparative Example 4, FIG. 7: the resin cured product of Comparative Example 5).

In the first embodiment, in a morphological image as observed from the direction vertical to the compression surface of the cured product by a transmission electron microscope (10,000× magnification), a phase separation structure consisting of a dispersed phase and a continuous phase is observed, so that high heat resistance inherent to PPE can be maintained in a composite with a crosslinking curable compound. This is presumed to be achieved because the presence of a phase separation structure allows the property of PPE, which has excellent heat resistance, to be predominate, although a phenomenon of reduction in the heat resistance inherent to PPE due to compatibilization of PPE with a crosslinking curable compound occurs at the time of formation of a composite of PPE and a crosslinking curable compound.

In addition, in a morphological image as observed from the direction vertical to the compression surface of the cured product by a transmission electron microscope (10,000× magnification), the area proportion of the dispersed phase is preferably from 10 to 80 area %. When the area proportion of the dispersed phase is 10 area % or more, high heat resistance is advantageously obtained. When the area proportion of the dispersed phase is 80 area % or less, high heat resistance is advantageously obtained more successfully.

The morphology observation by a transmission electron microscope (200,000× magnification) as used in the present disclosure means to further enlarge the continuous phase region observed in the morphological image by the transmission electron microscope (10,000× magnification) and observe the region. In FIGS. 8 to 14 described later, a transmission electron microscope (200,000× magnification) observation image in a visual field of 0.26 $\mu m^2$ (0.63 $\mu m \times 0.41$ $\mu m$) is illustrated.

In the first embodiment, the continuous phase observed by a transmission electron microscope (10,000× magnification) has a co-continuous structure including an A phase containing PPE (A) as the main component and a B phase containing the crosslinking curable compound (B) as the main component, in a morphological image of the continuous phase observed by a transmission electron microscope (200,000× magnification). In the present disclosure, the A phase containing PPE (A) as the main component means a phase containing PPE (A) in a larger amount than the crosslinking curable compound (B), and the B phase containing the crosslinking curable compound (B) as the main component means a phase containing the crosslinking curable compound (B) in a larger ratio than PPE (A). The "dispersed phase has a co-continuous structure including an A phase and a B phase" as used in the present disclosure means a state where each of the A phase and the B phase has a continuous structure. In the co-continuous structure of the present disclosure, as long as the structure is substantially a co-continuous structure, a portion where either the A phase or the B phase is dispersed may exist partially like a sea-island structure. In this case, the area of the portion where the phase is dispersed may sufficient if it is less than 50% of the total area of the transmission electron microscope image. The continuous phase takes on a co-continuous structure, whereby the feature of being excellent in the dielectric characteristics is developed.

Figure 8:
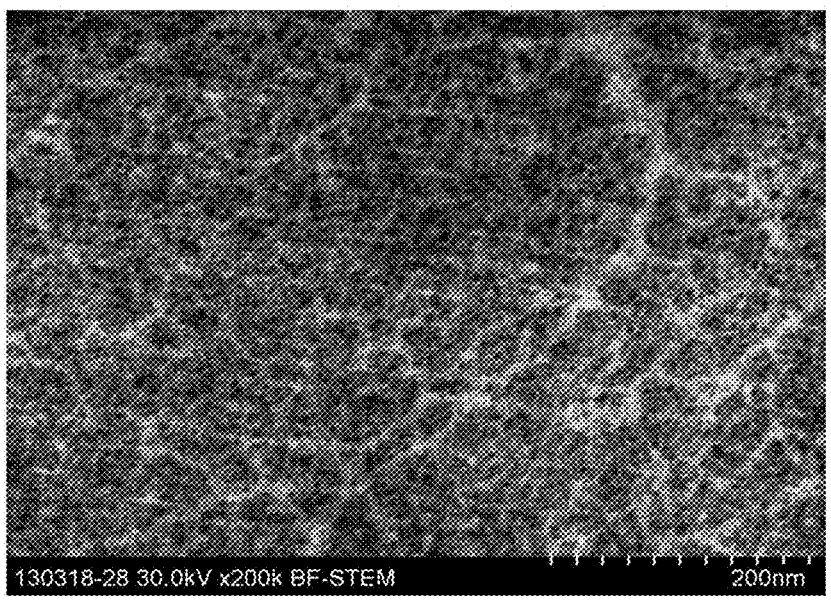
FIG. 8 A view illustrating a morphological image by a transmission electron microscope (200,000× magnification) of the cured product produced in Example 2.
Figure 9:
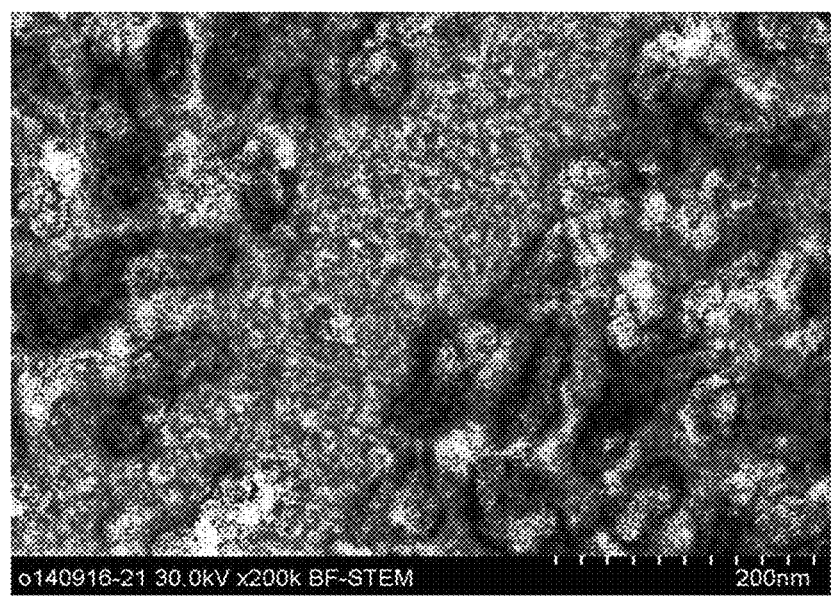
FIG. 9 A view illustrating a morphological image by a transmission electron microscope (200,000× magnification) of the cured product produced in Example 5.
Figure 10:
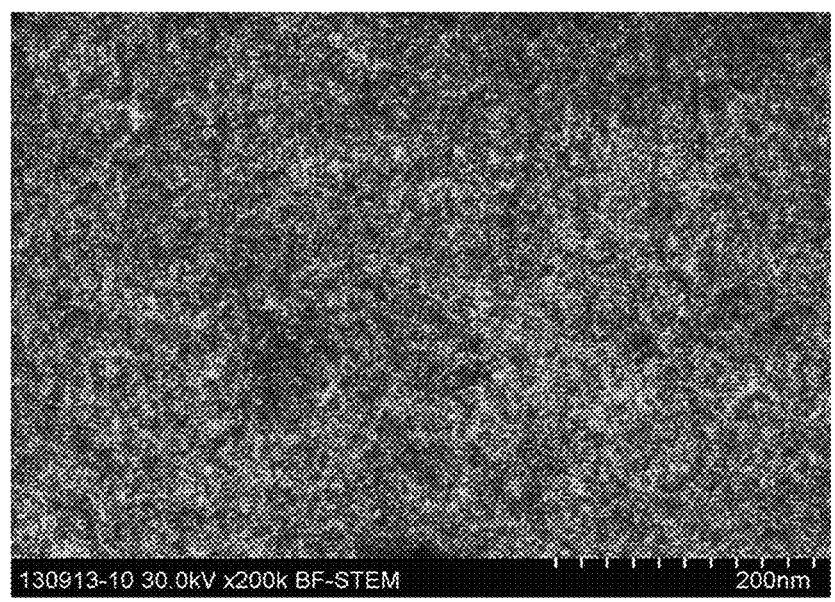
FIG. 10 A view illustrating a morphological image by a transmission electron microscope (200,000× magnification) of the cured product produced in Example 8.
Figure 11:
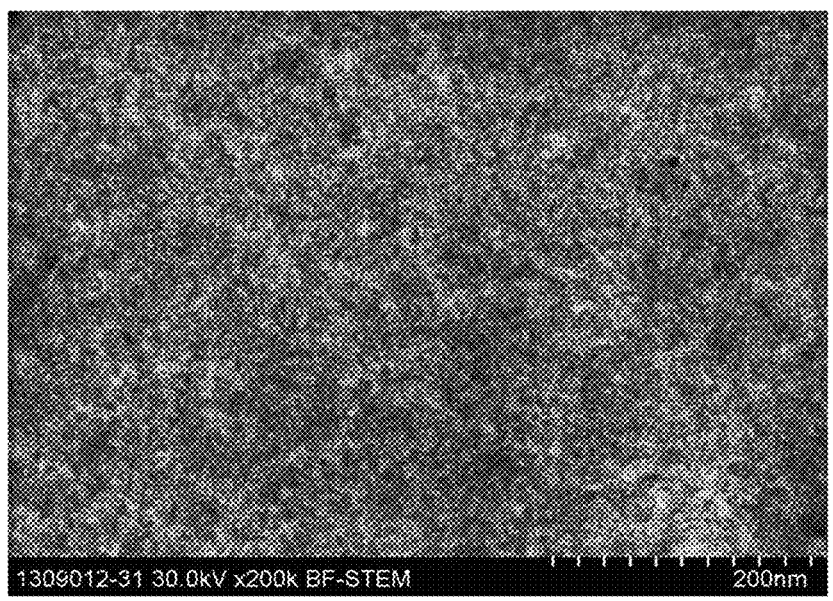
FIG. 11 A view illustrating a morphological image by a transmission electron microscope (200,000× magnification) of the cured product produced in Example 9.
Figure 12:
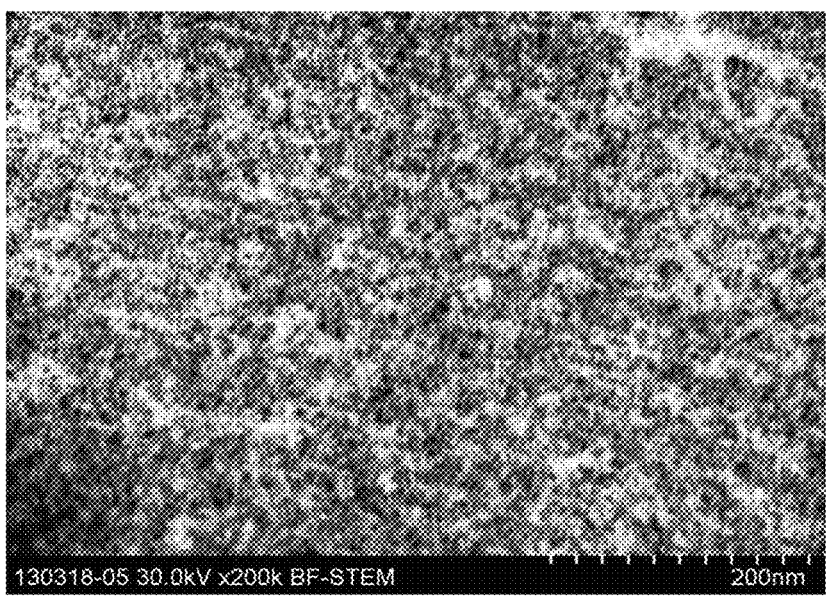
FIG. 12 A view illustrating a morphological image by a transmission electron microscope (200,000× magnification) of the cured product produced in Comparative Example 1.
Figure 13:
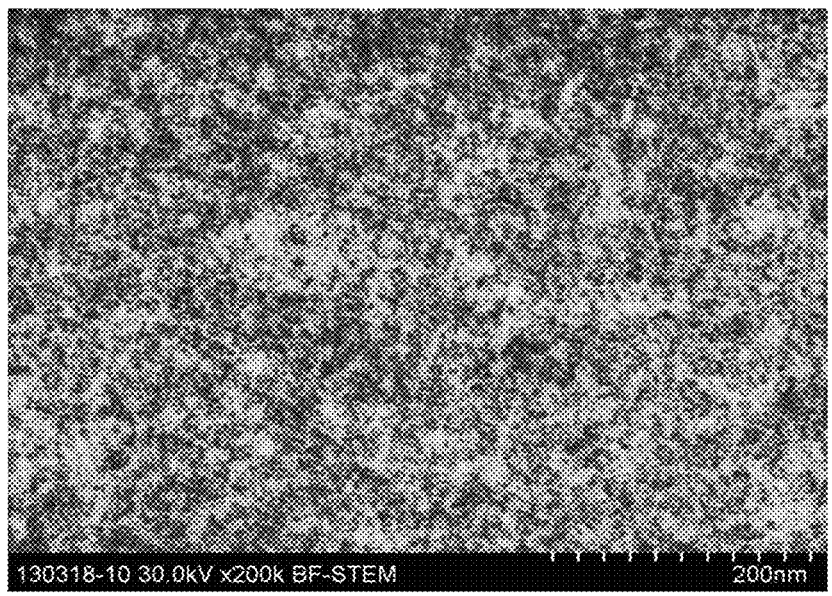
FIG. 13 A view illustrating a morphological image by a transmission electron microscope (200,000× magnification) of the cured product produced in Comparative Example 4.
Figure 14:
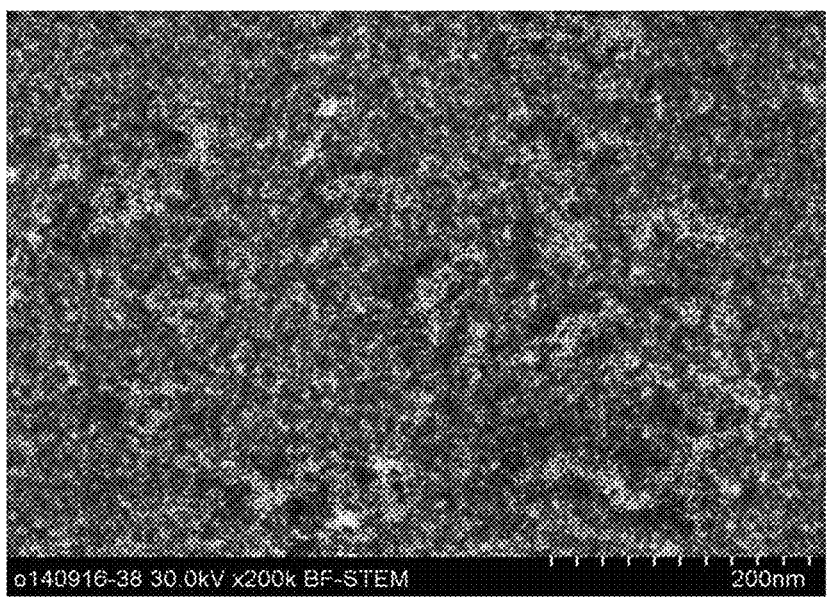
FIG. 14 A view illustrating a morphological image by a transmission electron microscope (200,000× magnification) of the cured product produced in Comparative Example 5.

FIGS. 8 to 14 illustrate transmission electron microscope images of resin cured products having a co-continuous structure (FIG. 8: Example 2, a transmission electron microscope image at 200,000× magnification of a region that is a continuous phase in observation at 10,000× magnification; FIG. 9: Example 5, a transmission electron microscope image when a portion including a dispersed phase and a continuous phase in observation at 10,000× magnification is observed at 200,000× magnification; FIG. 10: Example 8, a transmission electron microscope image at 200,000× magnification of a region that is a continuous phase in observation at 10,000× magnification; FIG. 11: Example 9, a transmission electron microscope image at 200,000× magnification of a region that is a continuous phase in observation at 10,000× magnification; FIG. 12: Comparative Example 1, a transmission electron microscope image at 200,000× magnification of a region that is a continuous phase in observation at 10,000× magnification; FIG. 13: Comparative Example 4, a transmission electron microscope image at 200,000× magnification of a region that is a continuous phase in observation at 10,000× magnification; FIG. 14: Comparative Example 5, a transmission electron microscope image at 200,000× magnification of a region that is a continuous phase in observation at 10,000× magnification).

In FIGS. 8 to 14, the phase (A phase) containing PPE (A) as the main component exists as a dark region due to staining with ruthenium tetroxide. On the other hand, the phase (B phase) containing the crosslinking curable compound (B) as the main component exists as a bright region. The resin cured products of FIGS. 8 to 14 have a co-continuous structure where each of the phase (A phase) containing PPE (A) as the main component and the crosslinking curable compound (B) is continuous.

In the first embodiment, the A phase containing PPE (A) as the main component and the B phase containing the crosslinking curable compound (B) as the main component form a co-continuous structured, so that good heat resistance can be imparted to the cured product by the crosslinking curable compound without impairing the dielectric characteristics inherent to PPE.

The specific method for forming a co-continuous structure includes, for example, a method where a compound capable of compatibilizing with PPE (A) in the process of a curing reaction but incapable of complete compatibilization after curing is used as the crosslinking curable compound (B), and the crosslinking rate of the crosslinking curable compound (B) is adjusted to a high rate range. In the process of allowing a crosslinking reaction of the crosslinking curable compound (B) to proceed from the compatibilized state of PPE (A) and the crosslinking curable compound (B) and collapsing the compatibilized state, the crosslinking reaction of the crosslinking curable compound (B) preferably makes a sufficient progress before the dispersed phase grows larger. Specifically, the method includes, for example, a method of using, as the crosslinking curable compound (B), a monomer having two or more unsaturated group in the molecule, and a method of increasing the blending amount of a reaction initiator for the crosslinking curable compound (B).

In the first embodiment, the structural period of the above-described co-continuous structure is preferably from 0.5 to 50 nm. The structural period is more preferably from 1 to 30 nm, still more preferably from 2 to 20 nm, and most preferably from 2 to 10 nm.

The structural period of the co-continuous structure is a value determined by the following method. A line segment corresponding to 200 nm is drawn (line segment (1)) in the co-continuous structure observed by a transmission electron microscope (200,000×), all distances between points of the line segment contacting with the A phase and the B phase are measured, and an average value thereof is determined. Subsequently, a line segment corresponding to 200 nm, running in parallel with the line segment above but being apart therefrom by 100 nm or more in terms of the distance orthogonal to the line segment above, is drawn (line segment (2)), all distances between points of this line segment contacting with the A phase and the B phase are similarly measured, and an average value thereof is determined. Furthermore, a line segment corresponding to 200 nm, orthogonal to line segment (1), is drawn (line segment (3)), all distances between points of this line segment contacting with the A phase and the B phase are similarly measured, and an average value thereof is determined. In addition, a line segment corresponding to 200 nm, running in parallel with line segment (3) but being apart therefrom by 100 nm or more in terms of the distance orthogonal to line segment (3), is drawn (line segment (4)), all distances between points of this line segment contacting with the A phase and the B phase are similarly measured, and an average value thereof is determined. An average value of line segments (1) to (4) is determined from the average values of the distance between points of each line segment contacting with the A phase and the B phase, which are obtained in line segments (1) to (4), and defined as the structural period of the co-continuous structure.

When the structural period of the co-continuous structure is 50 nm or less, the dielectric characteristics are advantageously more improved. This is presumed to be achieved because the phase structure is approximated to be uniform. On the other hand, when the structural period of the co-continuous structure is 0.5 nm or more, good heat resistance can be advantageously imparted to the cured product by the crosslinking curable compound without impairing the dielectric characteristics inherent to PPE.

The method for realizing the above-described structural period includes, for example, a method of adjusting the crosslinking rate of the crosslinking curable compound (B). Specifically, the method includes, for example, a method of using, as the crosslinking curable compound (B), a monomer having two or more unsaturated groups in the molecule, and adjusting the blending amount of a reaction initiator for the crosslinking curable compound (B).

In the first embodiment, the A phase exists preferably in the range of 40 to 90 area % in the co-continuous structure. The proportion of the A phase in the co-continuous structure is more preferably from 50 to 80 area %, still more preferably from 55 to 70 area %.

Whether a phase in the co-continuous structure is the A phase containing PPE (A) as the main component or the B phase containing the crosslinking curable compound (B) as the main component can be judged from the color of the phase by observing a sample stained with ruthenium tetroxide by means of a transmission electron microscope. In this method, at the time of transmission electron microscope observation, the A phase containing PPE (A) as the main component can be identified as a darkened phase. Specifically, a transmission electron microscope image (200,000× magnification) is processed as binary codes by an image editing software "image J", and in a graph where the abscissa is a gradation of 0 to 255 and the ordinate is an incidence frequency, the gradation as the peak top is defined as the threshold value of binary coded processing. The portion darker than the threshold value is judged as the A phase, the portion brighter than the threshold value is judged as the B phase, and the area of each portion is measured. However, for example, in the case where, as in FIG. 9, an image (200,000× magnification) allowing coexistence of a dispersed phase and a continuous phase is obtained as one image (200,000× magnification), the areas of the A phase and the B phase can be calculated by the method including following steps (i) to (iv) (hereinafter, referred to as "area integration method") by using an image at 10,000× magnification (for example, FIG. 2 corresponding to FIG. 9), which is the basis for obtaining the image (200,000× magnification):

(i) a step of extracting a plurality of portions at 200,000× magnification from the original image (10,000× magnification) as the basis for obtaining the image (200,000× magnification) allowing coexistence of a dispersed phase and a continuous phase;

(ii) a step of cutting out respective visual fields (200,000× magnification) allowing existence of only a continuous phase from each of the plurality of portions (200,000× magnification) extracted, and processing it to binary codes;

(iii) a step of repeating step (ii) until the total area of a plurality of visual fields (200,000× magnification) extracted, each allowing existence of only a continuous phase, reaches 0.26 $\mu m^2$; and (vi) a step of calculating the area of A phase and the area of B phase in the total area of 0.26 $\mu m^2$.

In the resin cured products illustrated in FIGS. 8 to 11 and 14, the area proportion of the A phase containing PPE (A) as the main component is 40 area % or more. On the other hand, in the resin cured products illustrated in FIGS. 12 and 13, the area proportion of the A phase containing PPE (A) as the main component is less than 40 area %.

When the area proportion of the A phase in the co-continuous structure is 40 area % or more, the dielectric characteristics of the cured product are advantageously reduced. This is presumed to be achieved because the feature of PPE being excellent in the dielectric characteristics predominates. On the other hand, when the proportion of the A phase in the co-continuous structure is 90 area % or less, heat resistance necessary for process compatibility can be advantageously ensured.

The specific method for realizing the above-described area proportion of the A phase in the co-continuous structure includes, for example, a method of adjusting the crosslinking rate of the crosslinking curable compound (B). Specifically, the method includes, for example, a method of using, as the crosslinking curable compound (B), a monomer having two or more unsaturated groups in the molecule, and adjusting the type and blending ratio of a crosslinking initiator for the crosslinking curable compound (B) and the temperature rise conditions at the time of heat/pressure forming.

Spherical Dispersed Phase:

In the first embodiment, in a morphological image at 10,000× magnification as observed from the direction vertical to the compression surface of the cured product by using a transmission electron microscope, a spherical dispersed phase having a long diameter ranging from 0.001 μm to less than 1.0 μm and a long diameter/short diameter ratio of 1.0 to 3.0 preferably exists.

Here, the long diameter, short diameter, and long diameter/short diameter ratio of the dispersed phase observed by a transmission electron microscope (10,000× magnification) as used in the present invention are values determined by the following methods. Line segments are drawn to pass inside the dispersed phase observed by a transmission electron microscope (10,000× magnification), and among the line segments obtained, the length of the longest line segment is defined as the long diameter of the dispersed phase. The short diameter of the dispersed phase observed by a transmission electron microscope (10,000× magnification) is a length of the longest straight line drawn inside a particle to be orthogonal to the longest line segment passing inside the dispersed phase drawn at the time of determining the long diameter, and the long diameter/short diameter ratio is a value obtained by dividing the long diameter by the short diameter for individual dispersed phases.

In a morphological image at 10,000× magnification as observed from the direction vertical to the compression surface by using a transmission electron microscope, a spherical dispersed phase with the long diameter ranging from 0.001 μm to less than 1.0 μm and the long diameter/short diameter ratio being from 1.0 to 3.0 exists in the phase separation structure, whereby good dielectric characteristics and high heat resistance are advantageously obtained. This is presumed to be achieved because the adherence at the boundary between a dispersed phase and a continuous phase is strengthened.

In a preferable range of the size of the spherical dispersed phase, the long diameter is from 0.1 to 0.9 μm, and the long diameter/short diameter ratio is from 1.0 to 2.5; and in a more preferable range, the long diameter is from 0.2 to 0.8 μm, and the long diameter/short diameter ratio is from 1.0 to 2.0.

When the long diameter of the spherical dispersed phase is 0.001 μm or more, the property of PPE being excellent in heat resistance emerges, and the heat resistance is advantageously improved. On the other hand, when the long diameter of the spherical dispersed phase is less than 1.0 μm, the adherence is thought to be strengthened at the boundary between a dispersed phase and a continuous phase, and dielectric characteristics and heat resistance are advantageously improved in a stable manner.

In addition, when the long diameter/short diameter ratio of the spherical dispersed phase is 3.0 or less, the adherence is strengthened at the boundary between a dispersed phase and a continuous phase, and dielectric characteristics and heat resistance are estimated to be advantageously improved. As the long diameter/short diameter ratio of the spherical dispersed phase is closer to 1, dielectric characteristics and heat resistance are advantageously more improved.

In a morphological image at 10,000× magnification as observed from the direction vertical to the compression surface of the cured product by using a transmission electron microscope, the area proportion of the spherical dispersed phase is preferably from 10 to 80 area %. When the area proportion of the spherical dispersed phase is 10 area % or more, the effect of the spherical dispersed phase of enhancing the heat resistance is advantageously increased. When the continuous phase is caused to exist such that the area proportion of the spherical dispersed phase is 80 area % or less, good dielectric characteristics are advantageously obtained.

String-Like Dispersed Phase:

In the first embodiment, in a morphological image at 10,000× magnification as observed from the direction vertical to the compression surface of the cured product by using a transmission electron microscope, a string-like dispersed phase having a long diameter of 1.0 to 18 μm, a short diameter of 0.001 to 2.0 μm, and a long diameter/short diameter ratio of 2.0 to 30 preferably exists, in addition to the spherical dispersed phase. Due to the presence of a string-like dispersed phase, high heat resistance inherent to PPE is advantageously maintained high also in a composite with the crosslinking curable compound (B). Coexistence of a spherical dispersed phase and a string-like dispersed phase is preferred, because high heat resistance and good dielectric characteristics can be satisfied at the same time.

With respect to the size of the string-like dispersed phase, preferably, the long diameter is from 1.0 to 18 μm, the short diameter is from 0.001 to 2.0 μm, and the long diameter/ short diameter ratio is from 2.0 to 30; more preferably, the long diameter is from 2.0 to 15 µm, the short diameter is from 0.001 to 1.8 µm, and the long diameter/short diameter ratio is from 8.0 to 25; and still more preferably, the long diameter is from 3.0 to 13 µm, the short diameter is from 0.001 to 1.6 µm, and the long diameter/short diameter ratio is from 10 to 20.

When the long diameter of the string-like dispersed phase is 1.0 µm or more, the property of PPE being excellent in heat resistance is considered to predominate, and heat resistance is advantageously improved. On the other hand, when the long diameter of the string-like dispersed phase is 18 µm or less, a crack, etc., are not produced between a dispersed phase and a continuous phase, and good dielectric characteristics are advantageously obtained in a stable manner.

When the short diameter is 0.001 µm or more, the property of PPE being excellent in heat resistance is considered to predominate, and heat resistance is advantageously improved. On the other hand, when the short diameter is 2.0 µm or less, a crack, etc., are not produced between a dispersed phase and a continuous phase, and good dielectric characteristics are advantageously obtained in a stable manner.

In addition, when the long diameter/short diameter ratio of the string-like dispersed phase is 2.0 or more, the property of PPE being excellent in heat resistance is considered to predominate, and heat resistance is advantageously improved. On the other hand, when the long diameter/short diameter ratio of the string-like dispersed phase is 30 or less, a crack, etc., are not produced between a dispersed phase and a continuous phase, and good dielectric characteristics are advantageously obtained in a stable manner.

In order to cause a spherical dispersed phase and a string-like dispersed phase to exist, in addition to controlling the compatibility of PPE (A) with the crosslinking curable compound (B), it is effective to simultaneously control the melt viscosity of a resin composition containing PPA (A) and the crosslinking curable compound (B) at the time of pressure/heat forming.

In a resin composition containing PPE (A) and the crosslinking curable compound (B), curing proceeds through a melted state in the pressure/heat forming step, and a phase separation structure is formed in this process. It is presumed that a stress due to pressurization acts on the melted state of the resin composition to cause orientation of components of the resin composition in the direction perpendicular to the pressure direction and formation of phase separation to occur at the same timing and therefore, the above-described spherical dispersed phase and string-like dispersed phase are formed. The compatibility of PPE (A) with the crosslinking curable compound (B) can be controlled by appropriately adjusting the molecular weight of PPE (A), the type of the crosslinking curable compound (B), the blending ratio between PPE (A) and the crosslinking curable compound (B), etc. The compatibility can also be controlled by using the later-described compatibilizer.

The melt viscosity at the time of pressure/heat-forming the resin composition can be controlled by appropriately adjusting the molecular weight of PPE (A), the blending ratio between PPE (A) and the crosslinking curable compound (B), the temperature rise rate, etc. The melt viscosity can also be controlled by using the later-described compatibilizer. The melt viscosity can also be controlled by properly controlling the solvent content of the resin composition before curing, etc.

In the above-described morphology observation by a transmission electron microscope (10,000× magnification), the area proportion of the spherical dispersed phase and the string-like dispersed phase is preferably from 10 to 80 area %. The proportion of the total of the area of the spherical dispersed phase and the string-like dispersed phase is more preferably from 12 to 60 area %, still more preferably from 15 to 50 area %.

The area proportion (X) of the spherical dispersed phase and the string-like dispersed phase is the following value. In a transmission electron microscope (10,000× magnification) observation image (a visual field of 105.9 µm$^2$ is obtained by the method described above), the total area (a) of all spherical dispersed phases existing in the observation image and the total area (b) of all string-like dispersed phases existing in the observation image are determined. The area proportion (X) is a value obtained by determining the ratio of a total of the total area (a) and the total area (b) to the total area (c) of observation image according to the following formula:

The area proportion (X) of total of area of spherical dispersed phase and area of string-like dispersed phase in total area of dispersed phase and continuous phase=$((a)+(b))/(c)\times 100$ When area proportion (X) is 10 area % or more, the effect of simultaneously satisfying high heat resistance and good dielectric characteristics is advantageously exerted successfully. When the ratio (X) is 80 area % or less, high heat resistance is advantageously obtained more successfully.

The method for realizing the above-described ratio (X) includes, for example, a method of controlling the compatibility of PPE (A) with the crosslinking curable compound (B). Specifically, the method includes, for example, a method where PPE having a number average molecular weight of 4,000 or more is used as PPE (A), a compound capable of compatibilizing with PPE (A) in the process of a curing reaction but incapable of complete compatibilization after curing (e.g., a monomer having two or more unsaturated groups in the molecule) is used as the crosslinking curable compound (B), and the blending ratio between PPE (A) and the crosslinking curable compound (B) is adjusted.

In the above-described morphology observed by a transmission electron microscope (10,000× magnification), the area proportion of the string-like dispersed phase is preferably from 50 to 90 area % relative to the total area of the spherical dispersed phase and the string-like dispersed phase. The area of the string-like dispersed phase is more preferably from 63 to 90 area %, still more preferably from 70 to 90 area %.

The area proportion of the string-like dispersed phase is a value determined using the total area (a) of all spherical dispersed phases existing in the observation image with a visual field of 105.9 µm$^2$ and the total area (b) of all string-like dispersed phases, which are obtained above, according to the following formula:

Area proportion of string-like dispersed phase=$(b)/((a)+(b))\times 100$

When the area proportion of the string-like dispersed phase is 90% or less, good dielectric characteristics and high heat resistance are advantageously obtained. This is presumed to be achieved because the adherence at the boundary between a dispersed phase and a continuous phase is strengthened. When the area proportion of the string-like dispersed phase is 50% or more, high heat resistance inherent to PPE can be advantageously maintained also in a composite with the crosslinking curable compound. This is presumed to be achieved because the property of PPE being excellent in heat resistance predominates.

The specific method for realizing the above-described area proportion includes, for example, a method where a compatibility combination allowing PPE (A) and the crosslinking curable compound (B) to taken on a phase separation structure (for example, by using, as the crosslinking curable compound (B) a monomer having two or more unsaturated groups in the molecule) is employed and furthermore, the melt viscosity of a resin composition containing PPA (A) and the crosslinking curable compound (B) at the time of pressure/heat forming is adjusted.

<Resin Composition>

In the first embodiment, the resin composition that is compression molded for forming a cured product, contains PPE (A) and a crosslinking curable compound (B) and may optionally contain other components, such as initiator, compatibilizer, resin other than PPE (A) and the crosslinking curable compound (B), and additive, in addition to PPE (A) and the crosslinking curable compound (B).

The components contained in the resin composition are described below.

<PPE (A)>

In the first embodiment, PPE (A) as a constituent of the cured product of a PPE-containing resin composition means a polymer composed of a substituted or unsubstituted phenylene ether unit structure. As long as the action and effect of the present invention are not impaired, PPE (A) may contain a copolymerization component unit other than a phenylene ether unit structure, but the amount of such a copolymerization component unit is typically 30% or less or 5% or less relative to the number of all unit structures.

PPE (A) preferably contains a repeating structural unit represented by following formula (1):

[Chem. 1]

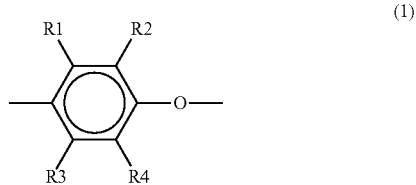

(1)

{wherein each of R1, R2, R3 and R4 independently represents hydrogen atom, a halogen atom, an alkyl group which may have a substituent, an alkoxy group which may have a substituent, an aryl group which may have a substituent, an amino group which may have a substituent, a nitro group or a carboxyl group}. The repeating structural unit represented by formula (1) is advantageous in view of excellent dielectric characteristics and heat resistance.

Specific examples of PPE include poly(2,6-dimethyl-1,4-phenylene ether), poly(2-methyl-6-ethyl-1,4-phenylene ether), poly(2-methyl-6-phenyl-1,4-phenylene ether), and poly(2,6-dichloro-1,4-phenylene ether) and further include a copolymer of 2,6-dimethylphenol with other phenols (e.g., 2,3,6-trimethylphenol, 2-methyl-6-butylphenol), and a PPE copolymer obtained by coupling of 2,6-dimethylphenol with biphenols or bisphenols. From the standpoint that the dielectric characteristics and heat resistance are excellent and a commercial production technology is established to enable stable utilization, a particularly preferable example is poly (2,6-dimethyl-1,4-phenylene ether).

PPE (A) may be a modified PPE obtained by modifying a molecular terminal phenolic hydroxyl group with another functional group. The functional group is not particularly limited and may be a benzyl group, an allyl group, a propargyl group, a glycidyl group, a vinylbenzyl group, a methacryl group, etc. A reaction product with an unsaturated carboxylic acid or an acid anhydride may also be used. Among these, in view of simple and easy production method, ease of commercial availability, and good adhesiveness of the cured product of the PPE-containing resin composition to a base material or a metal foil, such as copper foil, the preferable example of PPE (A) is a partially maleated PPE.

PPE (A) preferably has a number average molecular weight of 4,000 to 40,000. The number average molecular weight is more preferably from 6,000 to 30,000, still more preferably from 7,000 to 25,000.

Throughout the present disclosure, the molecular weight (number average molecular weight and weight average molecular weight) is a value measured in terms of standard polystyrene by using gel permeation chromatography (GPC). Typically, GPC measurement is carried out using Shodex LF-804×2 (manufactured by Showa Denko K.K.) for the column, chloroform at 50° C. for the eluent, and RI (refractometer) for the detector, and the number average molecular weight is calculated from a relational expression of the molecular weight of a standard polystyrene sample measured under the same conditions and the elution time.

When the number average molecular weight of PPE (A) is 4,000 or more, the glass transition temperature and solder heat resistance, which are desired in an electronic circuit board, etc., are advantageously imparted successfully to the cured product of a resin composition containing PEE (A). When the number average molecular weight of PPE (A) is 40,000 or less, the melt viscosity at the time of heat/pressure forming, etc., for obtaining a cured product is small, and good formability is advantageously obtained.

In the first embodiment, the content of PPE (A) is preferably from 20 to 60 mass % based on 100 mass % of the mass of the cured product of a resin composition containing PPE (A). The proportion of PPE (A) in the cured product is more preferably from 25 to 55 mass %, still more preferably from 28 to 50 mass %. When the content of PPE (A) in the cured product is 20 mass % or more, due to excellent electric characteristics inherent to PPE (A), the cured product of the PPE-containing resin composition is advantageously excellent in the electric characteristics. When the content of PPE (A) is 60 mass % or less, the melt viscosity at the time of heat/pressure forming, etc., for obtaining a cured product can be prevented from rising too much, and a uniform good cured product is advantageously obtained.

<Crosslinking Curable Compound (B)>

In the first embodiment, as long as a cured product of a resin composition containing PPE (A) and a crosslinking curable compound (B) is a structure exhibiting the morphology of the present invention, the crosslinking curable compound (B) as a constituent of the cured product of the PPE-containing resin composition is not particularly limited. As a typical example of the crosslinking curable compound (B), a monomer having two or more unsaturated groups in the molecule is preferred. A monomer having two or more unsaturated groups in the molecule and being capable of compatibilizing with PPE (A) in the process of a curing reaction of a resin composition containing PPE (A) and the crosslinking curable compound (B) is more preferred.

The temperature at which PPE (A) is compatibilized with the crosslinking curable compound (B) is preferably from 50 to 180° C., more preferably from 70 to 170° C., still more preferably from 90 to 160° C. The temperature (at which PPE (A) is compatibilized with the crosslinking curable compound (B)) of 50° C. or more is advantageous in that stable handling without compatibilization is achieved in normal ambient temperature and that the melt viscosity in the process of press molding of the PPE-containing resin composition can be kept appropriate and the moldability is excellent. The temperature (at which PPE (A) is compatibilized with the crosslinking curable compound (B)) of 180° C. or less is advantageous in that PPE (A) is compatibilized with the crosslinking curable compound (B) before a crosslinking reaction of the crosslinking curable compound (B) proceeds, and components in the PPE-containing resin composition are uniformly mixed.

The temperature at which PPE (A) is compatibilized with the crosslinking curable compound (B) can be determined by preparing a cast film composed of PPE (A) and the crosslinking curable compound (B) and observing the cast film under the heating condition by an optical microscope. As a specific example, first, PPE (A) and the crosslinking curable compound (B) are dissolved in trichloroethylene such that the total of PPE (A) and the crosslinking curable compound (B) is 10 mass % and after casting the resulting solution on a cover glass, trichloroethylene is removed by drying to produce a cast film on the cover glass. Next, optical microscope observation is carried out while heating the cast film on a heating stage, so as to observe whether or not PPE (A) is compatibilized with the crosslinking curable compound (B). During heating, the temperature is raised in 1° C. increments near the temperature at which compatibilization starts, and after reaching each temperature, held for 10 minutes or more, and the presence or absence of compatibilization is confirmed. The temperature at which uniform compatibilization could be confirmed can be determined as the compatibilizing temperature. This is done because by one-time compatibilizing PPE (A) with the crosslinking curable compound (B) in the process of a curing reaction, phase separation may occur along with the progress of the curing reaction, and therefore the morphology of the cured product is easily controlled.

The monomer having two or more unsaturated groups in the molecule includes, for example, triallyl isocyanurate (TAIC), triallyl cyanurate (TAC), trimethallyl cyanurate, trimethylolpropane trimethacrylate, divinylbenzene, divinylnaphthalene, diallyl phthalate, and diallyl cyanurate. Among these, TAIL, TAC, trimethallyl cyanurate, divinylbenzene, etc., are preferred in that they have good compatibility with PPE (A), and can also cause phase separation to occur along with the progress of the curing reaction.

The content of the crosslinking curable compound (B) in the cured product is preferably from 5 to 40 mass % based on 100 mass % of PPE (A). The content of the crosslinking curable compound (B) is more preferably from 10 to 30 mass %, more preferably from 14 to 24 mass %. When the content of the crosslinking curable compound (B) is 5 mass % or more, this is advantageous in that the morphology of the cured product of a resin composition containing PPE (A) is easily controlled to provide the structure specified in the present invention, in that the melt viscosity of the resin composition can be successfully reduced and the moldability is improved, and in that the heat resistance of the resin composition is enhanced.

On the other hand, when the content of the crosslinking curable compound (B) is 40 mass % or less, this is advantageous in that the morphology of the cured product of a resin composition containing PPE (A) is easily controlled to provide the structure specified in the present invention and in that excellent dielectric characteristics of PPE (A) can be brought out.

<Other Components>

The resin composition for forming the cured product according to the first embodiment may arbitrarily contain, for example, one or more members out of the following components, in addition to PPE (A) and the crosslinking curable compound (B).

[Initiator]

The resin composition for forming the cured product according to the first embodiment preferably further contains a compound functioning as an initiator for a crosslinking reaction of the crosslinking curable compound (B). As the initiator, for example, an arbitrary initiator having an ability of accelerating a polymerization reaction of the crosslinking curable compound, such as vinyl monomer, can be used, and an organic peroxide may be suitably used as the initiator. In that case, the resin composition preferably contains an organic peroxide (D) having a one-minute half-life temperature of 150 to 190° C.

Organic Peroxide (D):

The organic peroxide (D) has a one-minute half-life temperature of 150 to 190° C. The one-minute half-life temperature of the organic peroxide (D) is more preferably from 160 to 190° C., still more preferably from 165 to 190° C., and most preferably from 170 to 190° C. In the present disclosure, the one-minute half-life temperature is a temperature when the time after the organic peroxide is decomposed until the active oxygen amount thereof is halved is 1 minute. The one-minute half-life temperature is a value confirmed, for example, by a method of dissolving an organic peroxide in a radical-inactive solvent, such as benzene, to a concentration of 0.05 to 0.1 mol/L and thermally decomposing the organic peroxide solution under a nitrogen atmosphere.

When the one-minute half-life temperature of the organic peroxide (D) is 150° C. or more, at the time of subjecting the PPE-containing resin composition to heat/pressure molding, crosslinking of the crosslinking curable compound starts after PPE is sufficiently melted. Accordingly, a PPE-containing resin composition containing the organic peroxide (D) is preferred, because control to the morphology of the present invention is facilitated and the moldability is excellent. On the other hand, when the one-minute half-life temperature of the organic peroxide (D) is 190° C. or less, the decomposition rate of the organic peroxide under normal heat/pressure molding conditions (for example, at a maximum achievable temperature of 200° C.) is sufficiently high and therefore, the crosslinking reaction of the crosslinking curable compound can be allowed to efficiently and slowly proceed by using a relatively small amount (for example, in the range described below) of an organic peroxide. As a result, a cured product facilitating the control to the morphology of the present invention and having good electric characteristics (particularly, dielectric loss tangent) can be formed.

As the organic peroxide (D), for example, 2,5-dimethyl-2,5-di(tert-butylperoxy)hexane, tert-butyl peroxacetate, di-tert-butyl peroxide, tert-butylcumyl peroxide, α,α'-bis(tert-butylperoxy-m-isopropyl)benzene, 2,5-dimethyl-2,5-di(tert-butylperoxy)hexane, dicumyl peroxide, tert-butyl peroxybenzoate, 2,2-bis(tert-butylperoxy)butane, and 2,5-dimethyl-2,5-di(benzoylperoxy)hexane may be used. Among these, from the standpoint that a cured product being excellent in the heat resistance and furthermore, having a low dielectric constant and a low dielectric loss tangent can be obtained, α,α'-bis(tert-butylperoxy-m-isopropyl)benzene and 2,5-dimethyl-2,5-di(tert-butylperoxy)hexane are preferred.

In view of slowing the crosslinking reaction of the crosslinking curable compound, a particularly preferable combination of the crosslinking curable compound and the organic peroxide (D) is a combination of triallyl isocyanurate and α,α'-bis(tert-butylperoxy-m-isopropyl)benzene, or a combination of triallyl isocyanurate and 2,5-dimethyl-2,5-di(tert-butylperoxy)hexane.

In the first embodiment, the content of the organic peroxide (D) contained in the PPE-containing resin composition is preferably from 1 to 5 parts by mass based on 100 parts by mass of the total mass of PPE (A) and the crosslinking curable compound (D). The content of the organic peroxide (D) is more preferably from 1.4 to 4 parts by mass, still more preferably from 1.8 to 3.8 parts by mass. When the content of the organic peroxide (D) is 1 part by mass or more, the PPE-containing resin composition can be sufficiently cured during the normal heat/pressure molding step. On the other hand, when the content of the organic peroxide (D) is 5 parts by mass or less, the cured product has excellent electric characteristics. Why excellent electric characteristics are obtained is not clearly known but is presumed because the crosslinking reaction of the crosslinkable curable compound can be caused to slowly proceed and in turn, a cured product with little distortion is formed.

Organic Peroxide (F):

The resin composition for forming the cured product according to the first embodiment preferably further contains an organic peroxide (F) having a one-minute half-life temperature ranging from more than 190° C. to 250° C., in addition to the organic peroxide (D) having a one-minute half-life temperature of 150 to 190° C. The organic peroxide (F) includes, for example, 2,5-dimethyl-2,5-di(tert-butylperoxy)hexene-3, p-methane hydroperoxide, diisopropylbenzene hydroperoxide, and 1,1,3,3-tetramethylbutyl hydroperoxide. Among these, from the standpoint that a cured product being excellent in the heat resistance and furthermore, having a low dielectric constant and a low dielectric loss tangent can be obtained, 2,5-dimethyl-2,5-di(tert-butylperoxy)hexene-3 is preferred.

The content of the organic peroxide (F) in the PPE-containing resin composition is preferably from 1 to 3 parts by mass based on 100 parts by mass of the total mass of PPE and the crosslinking curable compound, and more preferably from 1.5 to 2.5 mass %. When the resin composition contains the organic peroxide (F) in the range of 1 to 3 parts by mass, in addition to the organic peroxide (D), the glass transition temperature (Tg) of the cured product can be increased and the heat resistance of the cured product can be thereby enhanced, without sacrificing electric characteristics of the resin composition or cured product.

[Compatibilizer]

In the first embodiment, the resin composition may further contain a compatibilizer, in addition to PPE (A) and the crosslinking curable compound (B). By incorporating a compatibilizer into the resin composition, the morphology of the cured product is advantageously easily controlled to provide the structure of the present disclosure.

As the compatibilizer, at least one selected from natural rubber, diene-based rubber, non-diene-based rubber, a thermoplastic elastomer, a phosphorus (P) atom-containing compound, etc., may be used. Among these, the thermoplastic elastomer and/or the P atom-containing compound are preferred.

As the thermoplastic elastomers, a styrene-based elastomer having a styrene skeleton in the hard segment (e.g., a styrene/butadiene/styrene block copolymer, a styrene/ethylene/butylene/styrene block copolymer, a styrene/butadiene/ethylene/butylene/styrene block copolymer, a styrene/isoprene/styrene block copolymer, a styrene/ethylene propylene/styrene block copolymer, a styrene/isobutylene/styrene block copolymer, etc.) is preferred, because the morphology of the cured product can be controlled within the range specified by the present invention without greatly changing the physical properties of the cured product formed using PPE (A) and the crosslinking curable compound (B).

Hydrogenated Block Copolymer (C)

As the styrene-based elastomer, a hydrogenated block copolymer (C) obtained by hydrogenating a block copolymer consisting of at least one polymer block mainly composed of a vinyl aromatic compound and at least one polymer block mainly composed of a conjugated diene compound may be preferably used. The hydrogenated block copolymer as used in the present disclosure means a copolymer where the number of double bonds (i.e., residual double bond ratio) based on the conjugated diene in the hydrogenated block copolymer is 90% or less relative to the number of double bonds based on the conjugated diene in the pre-hydrogenated block copolymer above (i.e., the block copolymer in the non-hydrogenated state). The residual double bond ratio is a value confirmed using a nuclear magnetic resonance apparatus (NMR), etc. The residual double bond ratio may be preferably 25% or less, more preferably 10% or less, still more preferably 5% or less, and in view of ease of production, may be preferably 0.5% or more, more preferably 1% or more.

More specifically, the block structure of the hydrogenated copolymer (C) means a structure having a polymer block (a) mainly composed of a vinyl aromatic compound and a polymer block (b) mainly composed of a conjugated diene compound, as follows. The polymer block (a) mainly composed of a vinyl aromatic compound is a vinyl aromatic compound polymer block, or a copolymer block of a vinyl aromatic compound and a hydrogenated conjugated diene copolymer, containing the vinyl aromatic compound in a ratio of more than 50 mass %, preferably 70 mass % or more. In addition, the polymer block (b) mainly composed of a conjugated diene compound is a hydrogenated conjugated diene compound polymer block, or a copolymer block of a hydrogenated conjugated diene compound and a vinyl aromatic compound, containing the hydrogenated conjugated diene compound in a ratio of more than 50 mass %, preferably 70 mass % or more. The distribution of the hydrogenated conjugated diene compound or the vinyl aromatic compound in the molecular chain of each of the polymer block (a) and the polymer block (b) may be a random distribution, a tapered distribution (i.e., a monomer component increases or decreases along the molecular chain), a partially blocked distribution, or an arbitrary combination thereof. In the case where two or more polymer blocks (a) or two or more polymer blocks (b) are present, respective polymer blocks may have the same structure or different structures.

The hydrogenated block copolymer (C) may have any of a linear molecular structure, a branched molecular structure (including a radial molecular structure), and an arbitrary combination thereof.

As the vinyl aromatic compound constituting the hydrogenated block copolymer (C), one member or two or more members may be selected from, for example, styrene, α-methylstyrene, p-methylstyrene, vinyl toluene, and p-tert-butylstyrene. Among others, in view of excellent compatibility of the vinyl aromatic compound moiety in the hydrogenated block copolymer with PPE and ease of control of the compatibility of the hydrogenated block copolymer (C) with PPE, styrene is preferred. As the conjugated diene compound before hydrogenation, for obtaining the hydrogenated conjugated diene compound, one member or two or more members are selected from, for example, butadiene, isoprene, 1,3-pentadiene, and 1,3-dimethyl-1,3-butadiene. Among others, since the conjugated diene compound moiety in the hydrogenated block copolymer is incompatible with PPE, from the standpoint of facilitating the control of compatibility of the hydrogenated block copolymer with PPE, butadiene, isoprene and a combination thereof are preferred. A particularly preferable example is a hydrogenated styrene/butadiene copolymer.

The content of the vinyl aromatic compound unit in the hydrogenated block copolymer is preferably from 5 to 50 mass %. The content of the vinyl aromatic compound unit is more preferably from 8 to 40 mass %, still more preferably from 10 to 35 mass %.

When the content of the vinyl aromatic compound unit is 5 mass % or more, the compatibility between PPE and the hydrogenated block copolymer (C) is sufficient and PPE and the hydrogenated block copolymer are homogeneously distributed, so that the adhesiveness of the cured product of the PPE-containing resin composition to a metal foil can be improved. On the other hand, when the content of the vinyl aromatic compound unit 50 mass % or less, the effect of improving the electric characteristics and heat resistance, which is developed by incorporating the hydrogenated block copolymer (C) into the PPE-containing resin composition, is remarkably obtained.

The weight average molecular weight of the hydrogenated block copolymer (C) is preferably from 30,000 to 300,000. The weight average molecular weight of the hydrogenated block copolymer is more preferably from 55,000 to 270,000, still more preferably from 80,000 to 220,000. When the weight average molecular weight is 30,000 or more, the thermal-expansion resistance of the PPE-containing resin composition is advantageously excellent. When the weight average molecular weight is 300,000 or less, the heat resistance of the cured product of the PPE-containing resin composition can be advantageously maintained.

The content of the hydrogenated block copolymer (C) in the PPE-containing resin composition is from 3 to 20 parts by mass, preferably from 4 to 18 parts by mass, still more preferably from 5 to 16 parts by mass, based on 100 parts by mass of the total mass of PPE (A) and the crosslinking curable compound (C). When the content of the hydrogenated block copolymer (C) is 3 parts by mass or more, the electric characteristics and heat resistance of the cured product of the PPE-containing resin composition are improved. When the content of the hydrogenated block copolymer (C) is 20 parts by mass or less, the thermal expansion resistance of the cured product and the adhesiveness of the cured product to a metal foil are improved.

P Atom-Containing Compound (E):

In the first embodiment, the resin composition preferably contains a phosphorus (P) atom-containing compound (E) compatible with both PPE (A) and the crosslinking curable compound (B), in addition to PPE (A) and the crosslinking curable compound (B). The resin composition containing a P atom-containing compound (E) can appropriately reduce the melt viscosity in the process of compression molding of the resin composition, and can control the morphology of the cured product within the range of the present invention, leading to a tendency that a cured product excellent in the dielectric characteristics and heat resistance is obtained. The P atom-containing compound (E) is not limited as long as it contains P atom and is compatible with both PPE (A) and the crosslinking curable compound (B), but the compound may be, for example, a phosphaphenanthrene derivative, phosphazene, an aromatic condensed phosphoric acid ester, etc.

The phosphaphenanthrene derivative (C) is a compound represented by following formula (2):

[Chem. 2]

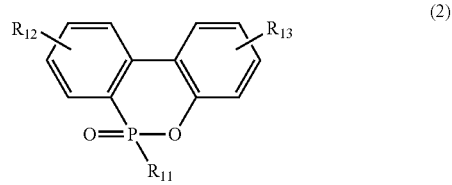

{wherein each of $R_{11}$, $R_{12}$ and $R_{13}$ is independently hydrogen atom or an organic group}.

From the standpoint that a resin composition excellent in the dielectric characteristics and heat resistance is obtained, the phosphaphenanthrene derivative represented by formula (2) is preferably a compound represented by following formula (3):

[Chem. 3]

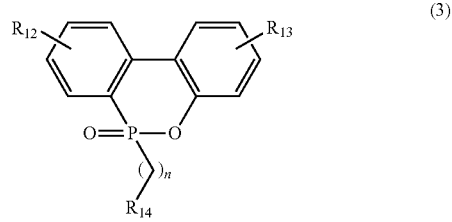

{wherein each of $R_{12}$ and $R_{13}$ is independently hydrogen atom or an organic group, n is an integer of 1 or more, and $R_{14}$ is a phenyl group, a linear or branched alkyl group, an alkenyl group, an alkynyl group or hydrogen atom}.

The phosphazene is a compound represented by following formula (4):

[Chem. 4]

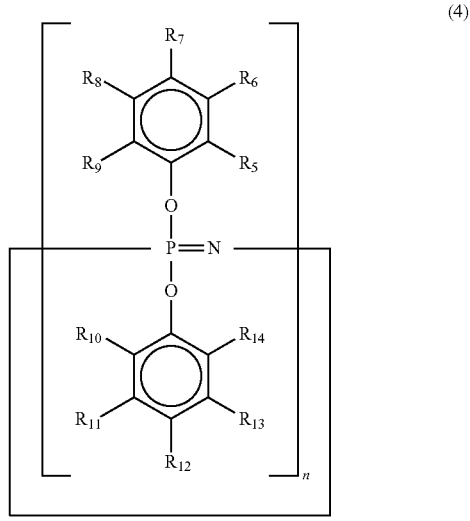

{wherein n is an integer of 3 to 25, and each of $R_5$ to $R_{14}$ is independently hydrogen atom or an organic group}.

The organic group in formula (4) is preferably a $C_1$-$C_{16}$ hydrocarbon group having an unsaturated double bond, such as vinyl group, allyl group, propargyl group, methallyl group, (meth)acryl group and styryl group; a hydroxyl group, a cyano group, a cyanate group, or a $C_1$-$C_{16}$ hydrocarbon group having such a functional group, etc. The phosphazene is also preferably a cyclic phosphazene.

From the standpoint that a resin composition excellent in the dielectric characteristics and heat resistance is obtained, the cyclic phosphazene is preferably phenoxyphosphazene, xylenoxyphosphazene or cyanophenoxyphosphazene.

As the aromatic condensed phosphoric acid ester, for example, 1,3-phenylenebis(diphenyl phosphate), bisphenol A bis(diphenyl phosphate), and 1,3-phenylenebis(di-2,6-xylenyl phosphate) may be used. From the standpoint that a resin composition excellent in the dielectric characteristics and heat resistance is obtained, 1,3-phenylenebis(di-2,6-xylenyl phosphate) is preferred.

The content of the P atom-containing compound (E) in the PPE-containing resin composition is from 0.5 to 15 parts by mass based on 100 parts by mass of the total mass of PPE (A) and the P atom-containing compound (E). The content of the P atom-containing compound (E) is preferably from 1 to 13 parts by mass, more preferably from 2 to 11 parts by mass, still more preferably from 3 to 10 parts by mass. When this content is 0.5 parts by mass or more, the melt viscosity of the PPE-containing resin composition in the process of press molding can be reduced, and when the content is 15 parts by mass or less, the feature of being excellent in the dielectric characteristics and the feature of being excellent in the heat resistance, which are inherent to PPE, are not impaired.

The total content of the crosslinking curable compound (B) and the P atom-containing compound (E) in the PPE-containing resin composition is preferably from 30 to 45 mass %, more preferably from 32 to 43 mass %, based on 100 mass % of the total mass of PPE (A), the crosslinking curable compound (B) and the P atom-containing compound (E).

[Another Resin]

In the first embodiment, the resin composition may contain another resin (e.g., thermoplastic resin, curable resin) different from PPE (A) and the crosslinking curable compound (B).

The thermoplastic resin includes, for example, a homopolymer of a vinyl compound, such as ethylene, propylene, butadiene, isoprene, styrene, divinylbenzene, methacrylic acid, acrylic acid, methacrylic acid ester, acrylic acid ester, vinyl chloride, acrylonitrile, maleic anhydride, vinyl acetate and ethylene tetrafluoride; a copolymer of two or more of these vinyl compounds; a polyamide, a polyimide, a polycarbonate, a polyester, a polyacetal, a polyphenylene sulfide, and a polyethylene glycol. Among these, a homopolymer of styrene, a styrene-butadiene copolymer, and a styrene-ethylene-butadiene copolymer may be preferably used in view of solubility in the solvent of the resin composition and formability.

The curable resin includes, for example, a phenolic resin, an epoxy resin, and cyanate esters. The above-described thermoplastic resin and curable resin may be a resin modified with a functional compound, such as acid anhydride, epoxy compound and amine.

The amount of the resin used is preferably, based on 100 parts by mass of PPE (A), 10 parts by mass or more, more preferably 15 parts by mass or more, still more preferably 20 parts by mass or more, and from the standpoint of bringing out excellent dielectric characteristics and heat resistance of PPE, is preferably 90 parts by mass or less, more preferably 70 parts by mass or less, still more preferably 50 parts by mass or less.

In the case of using an epoxy resin as another resin, from the standpoint of obtaining a resin composition capable of providing excellent dielectric characteristics of PPE to the cured product, the amount of the epoxy resin in the resin composition is preferably adjusted within a range of 0 to 10 mass %. Above all, in terms of enhancing the adhesiveness, the amount is more preferably adjusted within a range of 0.1 to 10 mass %.

[Other Additives]

In the first embodiment, the resin composition may further contain an appropriate additive, if desired. The additive includes a flame retardant, a heat stabilizer, an antioxidant, a UV absorber, a surfactant, a lubricant, a filler, a polymer additive, etc.

In particular, when the resin composition further contains a flame retardant, flame retardance can be advantageously imparted, in addition to the benefit of providing a printed circuit board that is improved in the formability, water absorption resistance and solder heat resistance and assured of excellent adhesiveness (for example, interlayer peel strength in a multilayered board or peel strength between the cured product and a copper foil, etc.).

The flame retardant is not particularly limited as long as it has a function of inhibiting a combustion mechanism, and the flame retardant includes, for example, an inorganic flame retardant, such as antimony trioxide, aluminum hydroxide, magnesium hydroxide and zinc borate; an aromatic bromine compound, such as hexabromobenzene, decabromodiphenylethane, 4,4-dibromobiphenyl and ethylene bistetrabromophthalimide; and a phosphorus-based flame retardant, such as resorcinol bis-diphenyl phosphate and resorcinol bis-dixylenyl phosphate. Among others, from the standpoint that the dielectric constant and dielectric loss tangent of the cured product obtained can be kept low, decabromodiphenylethane, etc., are preferred.

The amount of the flame retardant used differs depending on the type of the flame retardant used, and is not particularly limited, but in view of maintaining flame retardance at a UL standard 94V-0 level, the amount used is preferably 5 parts by mass or more, more preferably 10 parts by mass or more, still more preferably 15 parts by mass or more, per 100 parts by mass of the total of PPE (A) and the crosslinking curable compound (B). In addition, from the standpoint that the dielectric constant and dielectric loss tangent of the cured product obtained can be kept small, the amount used is preferably 50 parts by mass or less, more preferably 45 parts by mass or less, still more preferably 40 parts by mass or less.

<Electronic Circuit Substrate Material>

In a second embodiment of the present invention, an electronic circuit board material containing the cured product according to the first embodiment is provided. The electronic circuit board material may be a film-like or plate-like material in which the cured product exists alone, or may be a film-like or plate-like material that is a composite with a base material, etc. The electronic circuit substrate material may also be a film-like or plate-like material in which a film-like or plate-like material and a metal foil are integrated. In addition, the electronic circuit substrate material may be a laminate obtained by stacking film-like materials or plate-like materials.

An electronic circuit board fabricated using the electronic circuit board material according to the second embodiment may be a resin film, a composite obtained by curing a resin of a prepreg as an impregnated composite of a base material and the resin, a resin-attached metal foil, or a laminate composed of two or more thereof.

Specifically, the electronic circuit board fabricated using the electronic circuit board material may be a copper-clad laminate, a multilayered copper-clad laminate, a printed wiring board, a multilayered printed wiring board, etc., and the cured product according to the first embodiment is suitable as a construction material thereof.

EXAMPLES

The embodiments of the present invention are described in a more concrete manner below by referring to Examples, but the present invention is not limited to the following Examples in any sense.

In Examples and Comparative Examples, respective physical properties were measured by the following methods. More specifically, the dielectric constant and dielectric loss tangent were evaluated as indicators of electric characteristics, and the glass transition temperature, solder heat resistance, T288 test and T300 test were evaluated as indicators of heat resistance. The morphology observation of the cured product by a transmission electron microscope followed the method described in "MODE FOR CARRYING OUT THE INVENTION".

(1) Dielectric Constant and Dielectric Loss Tangent of Cured Product

The dielectric constant and dielectric loss tangent of a cured product specimen at 10 GHz were measured by the cavity resonance method.

The measurement apparatuses used were a network analyzer (N5230A, manufactured by Agilent Technologies) and a cavity resonator (Cavity Resonator S Series) manufactured by Kanto Electronic Application and Development Inc.

The cured product specimen was cut out into a size of width of about 2 mm and length of 50 mm, placed in an oven at 105° C.±2° C., dried for 2 hours, and left in an environment at 23° C. and a relative humidity of 65±5% for 96±5 hours, and using the thus-conditioned cured product specimen, the dielectric constant and dielectric loss tangent were measured using the measurement apparatuses above in an environment at 23° C. and a relative humidity of 65±5%

(2) Glass Transition Temperature of Cured Product

The dynamic viscoelasticity of a cured product specimen was measured, and the temperature providing maximum tan δ was determined as the glass transition temperature (Tg).

A dynamic viscoelasticity meter (RHEOVIBRON Model DDV-01FP, manufactured by ORIENTEC) was used for the measurement apparatus. Using a cured product specimen cut out into a length of about 35 mm, a width of about 12.5 mm and a thickness of about 0.3 mm, the measurement was carried out under the conditions of tensile mode and a frequency of 10 rad/s.

(3) Solder Heat Resistance of Cured Product after Water Absorption Accelerated Test A water absorption accelerated test was carried out as a pretreatment, and a solder heat resistance test of the cured product specimen after the water absorption accelerated test was carried out at 288° C.

(Water Absorption Accelerated Test)

A cured product specimen was cut out into a 50-mm square and subjected to a water absorption accelerated test.

After drying the specimen at 130° C. for 30 minutes, the water absorption accelerated test as a pressure cracker test was carried out under the conditions of a temperature: 121° C., a pressure: 2 atm, and a time: 4 hours.

(Solder Heat Resistance Test)

Using the specimen after the water absorption accelerated test, a solder heat resistance test at 288° C. was carried out.

The laminate specimen after the water absorption accelerated test was immersed in a solder bath at 288° C. for 20 seconds and observed with an eye. A laminate specimen in which that none of blistering, detachment and whitening was confirmed even when immersed in the solder bath at 288° C., was evaluated as "passed". On the other hand, a laminate specimen in which at least one of blistering, detachment and whitening was generated by the immersion in the solder bath at 288° C., was evaluated as "failed".

(4) T288 Heat Resistance Test of Cured Product

The time until the specimen undergoes delamination at 288° C. was measured by means of a thermomechanical analyzer (TMA).

A specimen was cut out into a 6.35-mm square, dried in an oven at 105° C. for 2 hours, and then cooled to room temperature of 23° C. in a desiccator. A load of 0.005 N was applied onto the specimen, heating was carried out in the load-applied state at a temperature rise rate of 10° C./min from room temperature to 288° C., and after reaching 288° C., the temperature was kept at 288° C. until delamination was generated. The time after reaching 288° C. until generation of delamination was shown as the T288 test result. In the case of a specimen where delamination was not generated for 60 minutes or more after reaching 288° C., the test was stopped in 60 minutes, and the time is denoted as 60 minutes or more.

(5) T300 Heat Resistance Test of Cured Product

The time until the specimen undergoes delamination under the condition of 300° C. was measured by means of a thermomechanical analyzer (TMA).

A specimen was cut out into a 6.35-mm square, dried in an oven at 105° C. for 2 hours, and then cooled to room temperature of 23° C. in a desiccator. A load of 0.005 N was applied onto the specimen, heating was carried out in the load-applied state at a temperature rise rate of 10° C./min from room temperature to 300° C., and after reaching 300° C., the temperature was kept at 300° C. until delamination was generated. The time after reaching 300° C. until generation of delamination was shown as the T300 test result. In the case of a specimen where delamination was not generated for 60 minutes or more after reaching 300° C., the test was stopped in 60 minutes, and the time is denoted as 60 minutes or more.

Production Example 1

Low-Molecular-Weight Terminal-Benzylated Polyphenylene Ether

A 10-L flask was placed in an oil bath heated at 90° C., and a nitrogen gas was introduced into the flask at 30 ml/min. Subsequent operations were always carried out with a nitrogen gas stream. To the flask, 1,000 g of PPE and 3,000 g of toluene were charged and dissolved by stirring. Furthermore, a solution obtained by dissolving 80 g of bisphenol A in 350 g of methanol was added to the flask while stirring. After continuing stirring for 5 minutes, 3 ml of a mineral spirit solution of 6 mass % cobalt naphthenate was added to the flask by means of a syringe, and stirring was continued for 5 minutes. Subsequently, a solution obtained by adding 1,125 g of toluene to 375 g of a benzoyl peroxide solution and diluting the solution to a benzoyl peroxide concentration of 10 mass % was put in a dropping funnel and dropped in the flask over 2 hours. After the completion of dropping, heating and stirring were further continued for 2 hours to obtain a reaction solution containing a low-molecular-weight PPE. The number average molecular weight of the obtained low-molecular-weight PPE was 2,800, and the average number of phenolic hydroxyl groups per molecule was 1.96.

Thereafter, the temperature of the reaction solution containing low-molecular-weight PPE was lowered to 50° C., and an aqueous solution obtained by dissolving 340 g of sodium hydroxide in 3,050 g of ion-exchanged water and 31 g of tetrabutylammonium iodide were added to the reaction solution, followed by stirring for 5 minutes. Subsequently, 1,070 g of benzyl chloride was added, and stirring was continued for 4 hours at a temperature of 50° C. to obtain a reaction solution containing a low-molecular-weight benzylated PPE. The reaction solution was left standing still for allowing separation into two layers and after removing the lower layer, 1,000 g of water was further added. The resulting mixture was stirred and left standing still for again allowing separation into two layers and after removing the lower layer, 200 g of methanol was added. This mixture was stirred and left standing in the same manner for allowing separation into two layers and after removing the upper layer, 100 g of methanol was further added. The resulting mixture was stirred and left standing still in the same manner for allowing separation into two layers and thereafter, the lower layer was recovered to obtain a reaction solution containing a low-molecular-weight benzylated PPE. A large amount of methanol was added thereto to precipitate the low-molecular-weight benzylated PPE, and the precipitate was separated by filtration and dried to obtain the low-molecular-weight benzylated PPE. The number average molecular weight of the obtained low-molecular-weight benzylated PPE was 3,000, and the average number of phenolic hydroxyl groups per molecule was 0.01.

[Raw Materials]

The raw materials used in Examples and Comparative Examples are shown below.

(PPE (A))

PPE S202A: produced by Asahi Kasei Chemicals Corp., number average molecular weight: 18,000

PPE S203A: produced by Asahi Kasei Chemicals Corp., number average molecular weight: 10,000

Low-molecular-weight terminally-benzylated PPE: PPE produced in Production Example 1, number average molecular weight: 3,000

(Crosslinking Curable Compound (B))

Triallyl isocyanurate: TALC, produced by Nippon Kasei Chemical Co., Ltd.

(Additive 1)

SEBS Tuftec H1041: produced by Asahi Kasei Chemicals Corp., a hydrogenated styrene/butadiene copolymer in a mass ratio of styrene unit/ethylene butylene unit of 30/70

SEBS Tuftec H1043: produced by Asahi Kasei Chemicals Corp., a hydrogenated styrene/butadiene copolymer in a mass ratio of styrene unit/ethylene.butylene unit of 67/33

SEBS Tuftec N504: produced by Asahi Kasei Chemicals Corp., a hydrogenated styrene/butadiene copolymer in a mass ratio of styrene unit/ethylene.butylene unit of 30/70

SOE L606 (styrenic elastomer): produced by Asahi Kasei Chemicals Corp.

PS PSJ-Polystyrene 685: produced by PS Japan Corp.

SBS Tufprene A: produced by Asahi Kasei Chemicals Corp., a non-hydrogenated styrene/butadiene copolymer in a mass ratio of styrene unit/butadiene unit of 40/60

(Initiator)

Perbutyl P: α,α'-bis(tert-butylperoxy-m-isopropyl)benzene, produced by NOF Corp., one-minute half-life temperature: 175.4° C.

Perhexyn 25B: 2,5-dimethyl-2,5-di(tert-butylperoxy)hexene-3, produced by NOF Corp., one-minute half-life temperature: 194.3° C.

(Flame Retardant)

Decabromodiphenylethane SAYTEX8010: produced by Albemarle Japan Corp.

(Filler)

Silica: spherical silica, produced by Tatsumori, Ltd.

Examples 1 to 7 and Comparative Examples 1 to 6

Each of resin compositions according to the formulations shown in Table 1 or 2 was mixed using a toluene solvent to prepare a resin varnish. A glass cloth (trade name: "2116", produced by Asahi-Schwebel Co., Ltd.) was impregnated with the resin varnish above and then dried at 120° C. for 2 minutes to obtain a prepreg having a resin composition solid content of 54 mass %. The later-described number of sheets of the prepreg were stacked and vacuum-pressed (heat/pressure molded) to obtain a cured product. The production of the cured product was carried out under the following conditions so as to obtain a specimen suited for each measurement.

Example 8

The resin composition shown in Table 1 was mixed using a mixed solvent of toluene and cyclohexanone to prepare a resin varnish. A glass cloth (trade name: "2116", produced by Asahi-Schwebel Co., Ltd.) was impregnated with the resin varnish and then dried at 150° C. for 4 minutes to obtain a prepreg having a resin composition solid content of 54 mass %. A specimen for evaluation was prepared in the same manner as in Example 1 by using the prepreg obtained.

Example 9

The production of a prepreg and the preparation of a specimen for evaluation were carried out in the same method as in Example 8, except that the drying conditions were 150° C. and 2 minutes.

(Cured Product Specimen for Measurement of Glass Transition Temperature and Test on Solder Heat Resistance after Water Absorption)

A laminate obtained by stacking two sheets of the prepreg and laminating a copper foil (thickness: 12 μm, GTS-MP foil, manufactured by Furukawa Electric Co., Ltd.) on the top and bottom of the stack was vacuum-pressed under the condition of a pressure of 5 kg/cm$^2$ while heating the laminate at a temperature rise rate of 3° C./min from room temperature; when reached 130° C., the laminate was vacuum-pressed under the condition of a pressure of 30 kg/cm$^2$ while heating at a temperature rise rate of 3° C./min; and when reached 200° C., vacuum-pressed under the conditions of a pressure of 30 kg/cm$^2$ and a time for 60 minutes while maintaining the temperature at 200° C., whereby a double-sided copper-clad laminate was obtained.

Subsequently, the copper foil was removed by etching to obtain a cured product specimen for tests on the glass transition temperature and solder heat resistance after water absorption.

(Cured Product Specimen for T288 and T300 Measurements)

A laminate obtained by stacking 8 sheets of the prepreg and laminating a copper foil (thickness: 35 μm, GTS-MP foil, manufactured by Furukawa Electric Co., Ltd.) on the top and bottom of the stack was vacuum-pressed under the condition of a pressure of 5 kg/cm$^2$ while heating at a temperature rise rate of 3° C./min from room temperature; when reached 130° C., vacuum-pressed under the condition of a pressure of 30 kg/cm$^2$ while heating at a temperature rise rate of 3° C./min; and when reached 200° C., vacuum-pressed under the conditions of a pressure of 30 kg/cm$^2$ and a time for 60 minutes while maintaining the temperature at 200° C., whereby a laminate sheet was prepared and a cured product specimen for T288 measurement was obtained.

(Cured Product Specimen for Measurements of Dielectric Constant and Dielectric Loss Tangent)

The copper foil was removed by etching from a part of the cured product specimen for T288 measurement above to obtain a cured product specimen for measurements of dielectric constant and dielectric loss tangent.

[Performance Test]

Using the cured product specimens obtained in Examples 1 to 9 and Comparative Examples 1 to 6, the measurements of dielectric constant, dielectric loss tangent and glass transition temperature, the solder heat resistance test, the T288 test and the T300 test were carried out by the methods described above.

As shown in Table 1 and FIG. 2 by the transmission electron microscope observation at 10,000× magnification of the cured product specimen of Example 5, a spherical dispersed phase was present. In all of Examples 1 to 4 and 6 to 8, a spherical dispersed phase and a string-like phase were present together in the transmission electron microscope observation at 10,000× magnification. In addition, in all of the cured product specimens of Examples 1 to 4 and 6 to 8, when a continuous phase moiety in the above-described transmission electron microscope observation at 10,000× magnification was further observed by a transmission electron microscope at 200,000× magnification, a co-continuous structure was observed, and the proportion of a phase containing PPE as the main component was 40 area % or more relative to the entirety. With respect to the cured product specimen of Example 5, the area % of the phase containing PPE as the main component (A phase) in the co-continuous structure is calculated by the area integration method described above, as a result, the area % of the A phase was 54%.

The cured product specimen of Example 5 was all excellent in terms of dielectric constant, dielectric loss tangent, glass transition temperature, solder heat resistance test and T288 test. Furthermore, in all of Examples 1 to 4 and 6 to 8, the cured product specimen passed the T300 test, in addition to the dielectric constant, dielectric loss tangent, glass transition temperature, solder heat resistance test and T288 test.

In Example 9 where the resin composition was the same as that of Example 8 but the drying conditions were weak compared with Example 8, the residual solvent content was large (the drying weight loss when heated at 100° C. for 15 minutes was 1.2% in Example 8, but in Example 9, the weight loss was 2.6% and larger than in Example 8). With respect to the cured product specimen of Example 9, in the transmission electron microscope observation at 10,000× magnification, the proportions of a spherical dispersed phase and a string-like dispersed phase were small, and a coarse dispersed phase larger than these phases was instead present. The reason therefor is presumed to be that the large residual solvent content brought about reduction in the melt viscosity from a relatively low temperature region (130 to 160° C.) at the time of pressing, causing orientation of the resin, and further orientation of the resin did not occur in a high temperature region (160° C. or more) where a curing reaction takes place, as a result, the dispersed phase arising along with a curing reaction grew large without undergoing orientation to the compression surface. The cured product specimen of Example 9 was excellent in terms of dielectric constant, dielectric loss tangent, glass transition temperature, solder heat resistance test and T288 test but failed in the T300 test.

In the case of the cured product specimen of Comparative Example 1, in the transmission electron microscope observation at 10,000× magnification, a relatively large number of spherical dispersed phases were present, but the proportion of a string-like dispersed phase was small, and many coarse dispersed phases larger than those dispersed phases were present. Since the one-minute half-life temperature of the organic peroxide used in Comparative Example 1 was high, a curing reaction and phase separation accompanying it are considered to have taken place on a relatively high temperature side (185° C. or more). It is presumed that the melt viscosity of the uncured resin composition was sufficiently reduced at a stage (up to 185° C.) before the start of phase separation, allowing the progress of orientation of the resin composition to the compression surface, and further orientation of the resin did not occur at 185° C. or more where a curing reaction takes place, as a result, the dispersed phase produced along with a curing reaction failed in undergoing an aggressive orientation to the compression surface. In addition, in the case of the cured product specimen of Comparative Example 1, when a continuous phase moiety in the transmission electron microscope observation at 10,000× magnification was further observed by a transmission electron microscope at 200,000× magnification, the proportion of a phase containing PPE as the main component was less than 40 area % relative to the entirety. The cured product specimen of Comparative Example 1 failed in the T300 test, and the dielectric loss tangent thereof was also high.

The resin composition of Comparative Example 2 contained a large amount of an organic peroxide, compared with Examples 1 and 2. In the case of the cured product specimen of Comparative Example 2, in a morphological image at 200,000× magnification by transmission electron microscope observation, the proportion of a phase containing PPE as the main component was less than 40 area % relative to the entirety. The cured product specimen of Comparative Example 2 was excellent in terms of glass transition temperature, solder heat resistance test and T288 test, but the dielectric loss tangent thereof was significantly high.

The resin composition of Comparative Example 3 had a small SEBS content, compared with Examples 1 and 2. In a morphological image at 10,000× magnification by transmission electron microscope observation, a small number of spherical dispersed phases were present, but a string-like dispersed phase was not present (a coarse dispersed phase larger than the string-like dispersed phase was also not present). It is presumed that since the SEBS content was small, large phase separation (which can be observed at 10,000× magnification) did not occur. In addition, in a morphological image at 200,000× magnification, a phase containing PPE as the main component was less than 40 area % relative to the entirety. The cured product specimen of Comparative Example 3 was poor in terms of both of heat resistance and dielectric loss tangent.

Comparative Example 4 corresponds to Example 3 described in International Publication No. 2014/141255, pamphlet. In Comparative Example 4, a phase separation structure was not observed in the transmission electron microscope observation at 10,000× magnification. The cured product specimen had low Tg and exhibited poor heat resistance.

Comparative Example 5 corresponds to Example 1 of International Publication No. 2014/141255, pamphlet. In Comparative Example 5, a phase separation structure was not observed in the transmission electron microscope observation at 10,000× magnification. The cured product specimen had low Tg and exhibited poor heat resistance.

In Comparative Example 6, SBS used in Patent Document 4 is blended. In Comparative Example 6, a phase separation structure was not observed in the transmission electron microscope observation at 10,000× magnification. The cured product specimen had low Tg and exhibited poor heat resistance.

TABLE 1

| | | | Example 1 | Example 2 | Example 3 | Example 4 | Example 5 |
|---|---|---|---|---|---|---|---|
| Composition (parts by mass) | PPE | Unmodified, Mn 18,000 (S203A) | 70 | 70 | 63 | 70 | 70 |
| | | Unmodified, Mn 10,000 (S203A) | | | | | |
| | | Low-molecular-weight benzylated PPE | | | 7 | | 30 |
| | Crosslinking curable compound | TAIC | 30 | 30 | 30 | 30 | |
| | Additive 1 | SEBS (Tuftec H1041) | 5 | 5 | 10 | | |
| | | SEBS (Tuftec H1043) | | | | 15 | |
| | | SEBS (Tuftec N504) | | | | | 5 |
| | | SOE (L606) | | | | | |
| | | PS (PSJ-Polystyrene 685) | | | | | |
| | | SBS (Tufprene A) | | | | | |
| | Initiator | Perbutyl P | 2 | 3 | 4.5 | 3 | 3 |
| | | Perhexane 25B | | | | | |
| | Flame Retardant | Decabromodiphenylethane | | | | | |
| | Filler | silica | | | | | |
| Morphology | TEM: 10,000x | Phase separation structure | present | present | present | present | present |
| | | Area % of dispersed phase | 27.5 | 26.9 | 33.0 | 17.4 | 25.2 |
| | | Spherical dispersed phase | present | present | present | present | present |
| | | Area % | 4.5 | 4.9 | 3.2 | 3.2 | 25.2 |
| | | String-like dispersed phase | present | present | present | present | None |
| | | Area % | 23.0 | 22.0 | 29.8 | 14.2 | — |
| | TEM: 200,000x | Co-continuous structure | present | present | present | present | present |
| | | Area % of A phase | 58 | 52 | 55 | 52 | 54 |
| Properties of cured product | | Dielectric constant [10 GHz] | 3.6 | 3.6 | 3.6 | 3.6 | 3.6 |
| | | Dielectric loss tangent [10 GHz] | 0.0053 | 0.0048 | 0.0050 | 0.0050 | 0.0049 |
| | | Tg [DMA] (° C.) | 190 | 204 | 206 | 195 | 200 |
| | | Solder heat resistance after water absorption test [288° C.] | passed | passed | passed | passed | passed |
| | | T288 (min) | >60 | >60 | >60 | >60 | >60 |
| | | T300 (min) | >60 | >60 | >60 | >60 | 13 |

| | | | Example 6 | Example 7 | Example 8 | Example 9 |
|---|---|---|---|---|---|---|
| Composition (parts by mass) | PPE | Unmodified, Mn 18,000 (S203A) | | 70 | 70 | 70 |
| | | Unmodified, Mn 10,000 (S203A) | 70 | | | |
| | | Low-molecular-weight benzylated PPE | | | | |
| | Crosslinking curable compound | TAIC | 30 | 30 | 30 | 30 |
| | Additive 1 | SEBS (Tuftec H1041) | 5 | 5 | 5 | 5 |
| | | SEBS (Tuftec H1043) | | | | |
| | | SEBS (Tuftec N504) | | | | |
| | | SOE (L606) | | | | |
| | | PS (PSJ-Polystyrene 685) | | | | |
| | | SBS (Tufprene A) | | | | |
| | Initiator | Perbutyl P | 3 | 2 | 3 | 3 |
| | | Perhexane 25B | | 0.5 | | |
| | Flame Retardant | Decabromodiphenylethane | | | | |
| | Filler | silica | | | | |
| Morphology | TEM: 10,000x | Phase separation structure | present | present | present | present |
| | | Area % of dispersed phase | 29.3 | 27.8 | 28.7 | 30.1 |
| | | Spherical dispersed phase | present | present | present | present |
| | | Area % | 5.4 | 4.2 | 2.8 | 1.1 |
| | | String-like dispersed phase | present | present | present | present |
| | | Area % | 23.9 | 23.6 | 25.9 | 8.6 |
| | TEM: 200,000x | Co-continuous structure | present | present | present | present |
| | | Area % of A phase | 51 | 54 | 60 | 54 |

TABLE 1-continued

| | | | | | | |
|---|---|---|---|---|---|---|
| Properties of cured product | Dielectric constant [10 GHz] | 3.6 | 3.6 | 3.6 | 3.6 | |
| | Dielectric loss tangent [10 GHz] | 0.0050 | 0.0049 | 0.0045 | 0.0050 | |
| | Tg [DMA] (° C.) | 202 | 210 | 201 | 182 | |
| | Solder heat resistance after water absorption test [288° C.] | passed | passed | passed | passed | |
| | T288 (min) | >60 | >60 | >60 | >60 | |
| | T300 (min) | >60 | >60 | >60 | 12 | |

TABLE 2

| | | | Comparative Example 1 | Comparative Example 2 | Comparative Example 3 | Comparative Example 4 | Comparative Example 5 | Comparative Example 6 |
|---|---|---|---|---|---|---|---|---|
| Composition (parts by mass) | PPE | Unmodified, Mn 18,000 (S203A) | 70 | 70 | 70 | 70 | 70 | 70 |
| | | Unmodified, Mn 10,000 (S203A) | | | | | | |
| | | Low-molecular-weight benzylated PPE | | | | | | |
| | Crosslinking curable compound | TAIC | 30 | 30 | 30 | 30 | 30 | 30 |
| | Additive 1 | SEBS (Tuftec H1041) | 5 | 5 | 1 | | | |
| | | SEBS (Tuftec H1043) | | | | | | |
| | | SEBS (Tuftec N504) | | | | | | |
| | | SOE (L606) | | | | | 5 | |
| | | PS (PSJ-Polystyrene 685) | | | | 5 | | |
| | | SBS (Tufprene A) | | | | | | 5 |
| | Initiator | Perbutyl P | | 6 | 3 | 3 | 3 | 3 |
| | | Perhexane 25B | 3 | | | | | |
| | Flame Retardant | Decabromodiphenylethane | | | | | | |
| | Filler | silica | | | | | | |
| Morphology | TEM: 10,000× | Phase separation structure | present | present | present | none | none | none |
| | | Area % of dispersed phase | 28.2 | 23.7 | 2.6 | — | — | — |
| | | Spherical dispersed phase | present | present | present | none | none | none |
| | | Area % | 8.8 | 3.2 | 2.6 | — | — | — |
| | | String-like dispersed phase | present | present | none | none | none | none |
| | | Area % | 3.2 | 19.8 | — | — | — | — |
| | TEM: 200,000× | Co-continuous structure | present | present | present | present | present | present |
| | | Area % of A phase | 37 | 37 | 36 | 35 | 51 | 53 |
| Properties of cured product | | Dielectric constant [10 GHz] | 3.6 | 3.6 | 3.6 | 3.6 | 3.6 | 3.6 |
| | | Dielectric loss tangent [10 GHz] | 0.0060 | 0.0056 | 0.0068 | 0.0074 | 0.0052 | 0.0053 |
| | | Tg [DMA] (° C.) | 197 | 212 | 173 | 171 | 179 | 174 |
| | | Solder heat resistance after water absorption test [288° C.] | passed | passed | failed | failed | passed | passed |
| | | T288 (min) | >60 | >60 | 15 | 1 | 6 | 5 |
| | | T300 (min) | 20 | >60 | — | — | — | — |

The invention claimed is:

1. A cured product obtained by compression-molding a resin composition containing a polyphenylene ether (A) and a crosslinking curable compound (B), wherein
in a morphological image at 10,000× magnification as observed from a direction vertical to a compression surface by using a transmission electron microscope, a phase separation structure consisting of a dispersed phase and a continuous phase is observed, and
in a morphological image at 200,000× magnification as observed from the direction vertical to the compression surface by using the transmission electron microscope, the continuous phase has a co-continuous structure including an A phase mainly containing the polyphenylene ether (A) and a B phase mainly containing the crosslinking curable compound (B), and the area proportion of the A phase in the continuous phase is from 50 to 80 area %.

2. The cured product according to claim 1, wherein in the morphological image at 200,000× magnification as observed from the direction vertical to the compression surface by using the transmission electron microscope, the structural period of the co-continuous structure is from 0.5 to 50 nm.

3. The cured product according to claim 1, wherein in the morphological image at 200,000× magnification as observed from the direction vertical to the compression surface by using the transmission electron microscope, the area proportion of the A phase in the continuous phase is from 55 to 70 area %.

4. The cured product according to claim 1, wherein in the morphological image at 10,000× magnification as observed from the direction vertical to the compression surface by using the transmission electron microscope, the area proportion of the dispersed phase is from 10 to 80 area %.

5. The cured product according to claim 1, wherein in a morphological image at 10,000× magnification as observed from the direction vertical to the compression surface by using the transmission electron microscope, a spherical dispersed phase having a long diameter ranging from 0.001 μm to less than 1.0 μm and a long diameter/short diameter ratio of 1.0 to 3.0 exists.

6. The cured product according to claim 5, wherein in a morphological image at 10,000× magnification as observed from the direction vertical to the compression surface by using a transmission electron microscope, the area proportion of the spherical dispersed phase is from 10 to 80 area %.

7. The cured product according to claim 5, wherein in a morphological image at 10,000× magnification as observed from the direction vertical to the compression surface by using a transmission electron microscope, a string-like dispersed phase having a long diameter of 1.0 to 18 μm short diameter of 0.001 to 2.0 μm, and a long diameter/short diameter ratio of 2.0 to 30 exists, in addition to the spherical dispersed phase.

8. The cured product according to claim 7, wherein in a morphological image at 10,000× magnification as observed from the direction vertical to the compression surface by using a transmission electron microscope, the area proportion of the spherical dispersed phase and the string-like dispersed phase is from 10 to 80 area %.

9. The cured product according to claim 7, wherein in a morphological image at 10,000× magnification as observed from the direction vertical to the compression surface by using a transmission electron microscope, the area proportion of the string-like dispersed phase is from 50 to 90 area % relative to the total of areas of the spherical dispersed phase and the string-like dispersed phase.

10. The cured product according to claim 7, wherein in a morphological image at 10,000× magnification as observed from the direction vertical to the compression surface by using a transmission electron microscope, the area proportion of the string-like dispersed phase is from 70 to 90 area % relative to the total of areas of the spherical dispersed phase and the string-like dispersed phase.

11. The cured product according to claim 1, wherein the content of the polyphenylene ether (A) is from 20 to 60 mass % based on 100 mass % of the mass of the cured product.

12. The cured product according to claim 1, wherein the resin composition further contains a hydrogenated block copolymer (C) obtained by hydrogenating a vinyl aromatic compound-conjugated diene compound block copolymer and an organic peroxide (D), in addition to the polyphenylene ether (A) and the crosslinking curable compound (B), a content of a vinyl aromatic compound unit in the hydrogenated block copolymer (C) is from 5 to 50 mass %, a content of the hydrogenated block copolymer (C) is from 3 to 20 parts by mass based on 100 parts by mass of the total mass of the polyphenylene ether (A) and the crosslinking curable compound (B), a one-minute half-life temperature of the organic peroxide (D) is from 150 to 190° C., and the content of the organic peroxide (D) is from 1 to 5 parts by mass based on 100 parts by mass of the total mass of the polyphenylene ether (A) and the crosslinking curable compound (B).

13. The cured product according to claim 12, wherein the composition further contains an organic peroxide (F) having a one-minute half-life temperature ranging from more than 190° C. to 250° C. and the content of the organic peroxide (F) is from 1 to 3 parts by mass based on 100 parts by mass of the total mass of the polyphenylene ether (A) and the crosslinking curable compound (B).

14. The cured product according to claim 1, wherein the composition further contains a P atom-containing compound (E) compatible with both of the polyphenylene ether (A) and the crosslinking curable compound (B), in addition to the polyphenylene ether (A) and the crosslinking curable compound (B), the content of the P atom-containing compound (E) is from 0.5 to 15 parts by mass based on 100 parts by mass of the total mass of the polyphenylene ether (A) and the P atom-containing compound (E), and the total content of the crosslinking curable compound (B) and the P atom-containing compound (E) is from 30 to 45 mass % based on 100 mass % of the total mass of the polyphenylene ether (A), the crosslinking curable compound (B) and the P atom-containing compound (E).

15. An electronic circuit substrate containing the cured product according to claim 1, which is selected from a resin film, a composite obtained by curing a resin of a prepreg as an impregnated composite of a base material and the resin, a resin-attached metal foil, and a laminate composed of two or more thereof.

* * * * *